(12) United States Patent
Luo et al.

(10) Patent No.: US 11,641,741 B2
(45) Date of Patent: May 2, 2023

(54) MICROELECTRONIC DEVICES WITH TIERED BLOCKS SEPARATED BY PROGRESSIVELY SPACED SLITS, AND RELATED METHODS AND SYSTEMS

(71) Applicant: Micron Technology, Inc., Boise, ID (US)

(72) Inventors: Kaiming Luo, Singapore (SG); Sarfraz Qureshi, Singapore (SG); Md Zakir Ullah, Singapore (SG); Jessica Jing Wen Low, Singapore (SG); Harsh Narendrakumar Jain, Boise, ID (US); Kok Siak Tang, Singapore (SG); Indra V. Chary, Boise, ID (US); Matthew J. King, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 107 days.

(21) Appl. No.: 17/016,039

(22) Filed: Sep. 9, 2020

(65) Prior Publication Data

US 2022/0077178 A1  Mar. 10, 2022

(51) Int. Cl.
*H01L 27/11521* (2017.01)
*H01L 27/11582* (2017.01)
*H01L 27/11556* (2017.01)
*H01L 27/11568* (2017.01)

(52) U.S. Cl.
CPC .. *H01L 27/11582* (2013.01); *H01L 27/11521* (2013.01); *H01L 27/11556* (2013.01); *H01L 27/11568* (2013.01)

(58) Field of Classification Search
CPC ......... H01L 27/11556; H01L 27/11565; H01L 27/11582; H01L 27/11568
See application file for complete search history.

(56) References Cited

U.S. PATENT DOCUMENTS

| | | | |
|---|---|---|---|
| 6,730,444 B2 | 5/2004 | Bowes | |
| 6,969,866 B1 | 11/2005 | Lowrey et al. | |
| 7,473,574 B2 | 1/2009 | Kostylev et al. | |
| 8,822,108 B2 | 9/2014 | Rolfson | |
| 8,945,996 B2 | 2/2015 | Tang et al. | |
| 9,564,471 B2 | 2/2017 | Tang et al. | |
| 9,577,188 B2 | 2/2017 | Cupeta et al. | |
| 9,633,945 B1* | 4/2017 | Mizutani | H01L 23/5226 |
| 10,475,737 B2 | 11/2019 | Tang et al. | |
| 10,622,558 B2 | 4/2020 | Fratin et al. | |
| 2007/0022599 A1 | 2/2007 | Trivedi | |
| 2017/0179144 A1* | 6/2017 | Han | H01L 27/11568 |

(Continued)

*Primary Examiner* — Sarah K Salerno
(74) *Attorney, Agent, or Firm* — TraskBritt

(57) ABSTRACT

Microelectronic devices include a stack structure with a vertically alternating sequence of insulative structures and conductive structures arranged in tiers. A series of slit structures extends through the stack structure and divides the stack structure into a series of blocks. In a progressed portion of the series of blocks, each block comprises an array of pillars extending through the stack structure of the block. Also, each block—in the progressed portion—has a different block width than a block width of a neighboring block of the progressed portion of the series of blocks. At least one pillar, of the pillars of the array of pillars in the progressed portion, exhibits bending. Related methods and electronic systems are also disclosed.

23 Claims, 14 Drawing Sheets

(56) References Cited

U.S. PATENT DOCUMENTS

2018/0374867 A1* 12/2018 Yun .................... H01L 27/1157
2019/0043875 A1    2/2019 Parat et al.
2020/0051904 A1    2/2020 Tang et al.

* cited by examiner

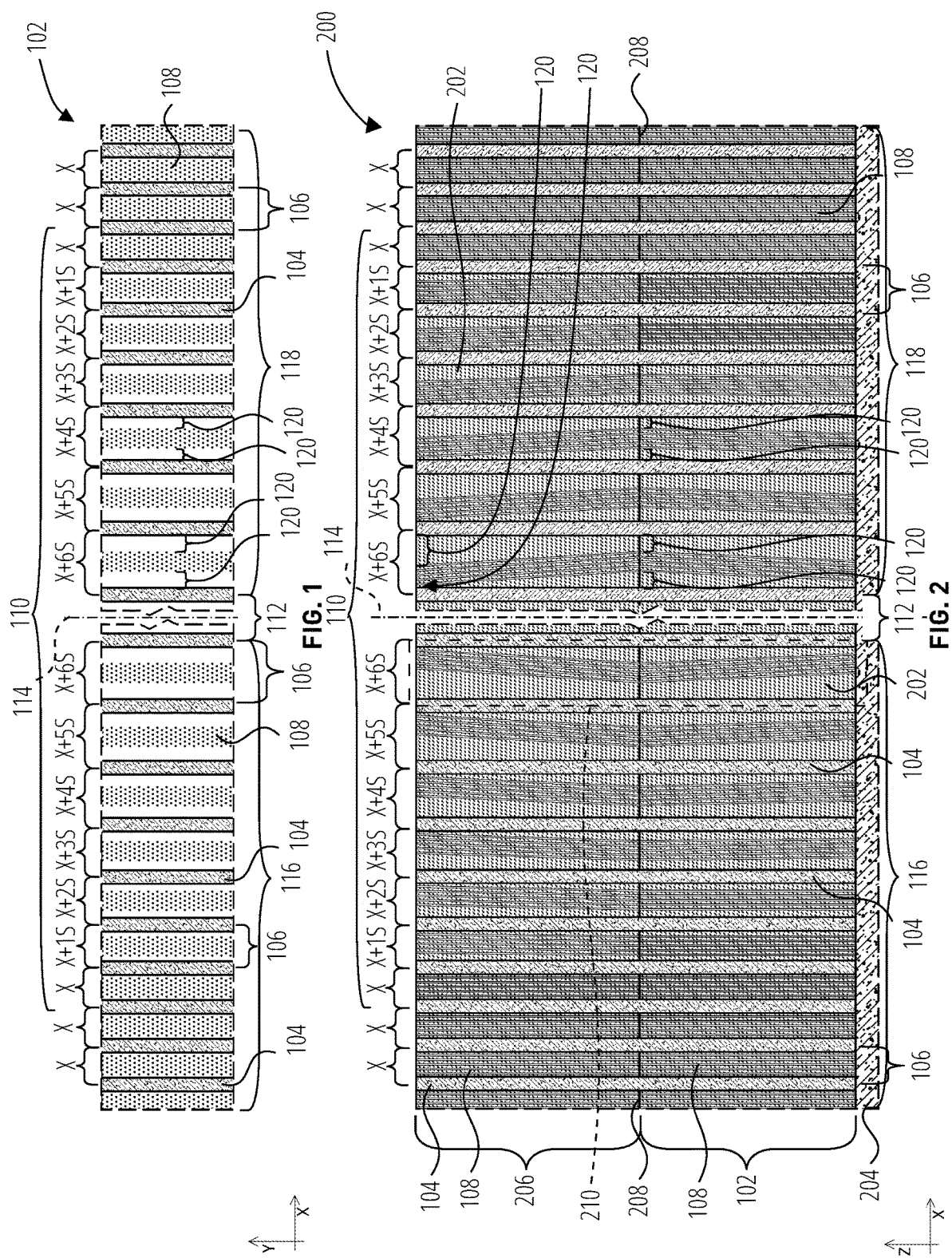

MICROELECTRONIC DEVICES WITH TIERED BLOCKS SEPARATED BY PROGRESSIVELY SPACED SLITS, AND RELATED METHODS AND SYSTEMS

TECHNICAL FIELD

Embodiments of the disclosure relate to the field of microelectronic device design and fabrication. More particularly, the disclosure relates to methods for forming microelectronic devices (e.g., memory devices, such as 3D NAND memory devices) having tiered stack structures that include vertically alternating conductive structures and insulative structures, to related systems, and to methods for forming such structures and devices.

BACKGROUND

Memory devices provide data storage for electronic systems. A Flash memory device is one of various memory device types and has numerous uses in modern computers and other electrical devices. A conventional Flash memory device may include a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line).

In a "three-dimensional NAND" memory device (which may also be referred to herein as a "3D NAND" memory device), a type of vertical memory device, not only are the memory cells arranged in row and column fashion in a horizontal array, but tiers of the horizontal arrays are stacked over one another (e.g., as vertical strings of memory cells) to provide a "three-dimensional array" of the memory cells. The stack of tiers vertically alternate conductive materials with insulating (e.g., dielectric) materials. The conductive materials function as control gates for, e.g., access lines (e.g., word lines) of the memory cells. Vertical structures (e.g., pillars comprising channel structures and tunneling structures) extend along the vertical string of memory cells. A drain end of a string is adjacent one of the top and bottom of the vertical structure (e.g., pillar), while a source end of the string is adjacent the other of the top and bottom of the pillar. The drain end is operably connected to a bit line, while the source end is operably connected to a source line. A 3D NAND memory device also includes electrical connections between, e.g., access lines (e.g., word lines) and other conductive structures of the device so that the memory cells of the vertical strings can be selected for writing, reading, and erasing operations.

Forming 3D NAND memory devices tends to present challenges. For example, differing residual stresses at various dispositions along a wafer, or relative to a particular feature being constructed on the wafer, may result in some features, intended to be truly vertical, bending away from true vertical. Such bending may lead to the features bending toward or into structure portions that are to be removed (e.g., etched). The bending may, therefore, lead to neighboring materials, or even portions of the features themselves, being unintentionally removed (e.g., etched), which may ultimately cause device failure. Thus, reliably fabricating the features of microelectronic devices, such as 3D NAND memory devices, presents challenges.

BRIEF DESCRIPTION OF THE DRAWINGS

FIG. 1 is a top plan, schematic illustration of a lower deck of a microelectronic device structure with a series of blocks separated from one another by progressively-spaced slit structures, in accordance with embodiments of the disclosure.

FIG. 2 is a cross-sectional, elevational, schematic illustration of a microelectronic device structure, including the lower deck of FIG. 1, in accordance with embodiments of the disclosure.

DETAILED DESCRIPTION

Figure 3:
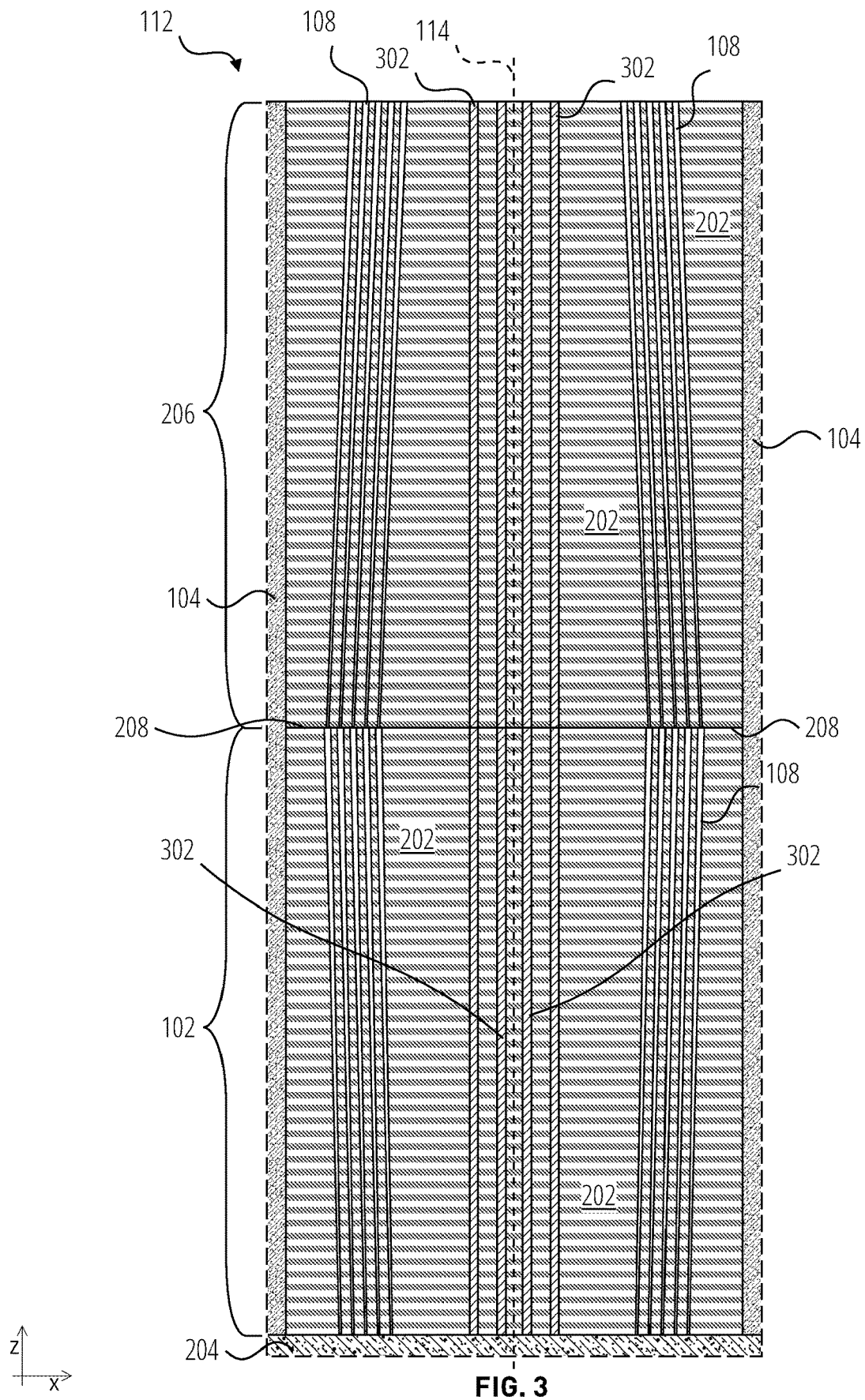
FIG. 3 is a cross-sectional, elevational, schematic illustration of a portion of the microelectronic device structure of FIG. 2, in accordance with embodiments of the disclosure.

Structures (e.g., microelectronic device structures), apparatus (e.g., microelectronic devices), and systems (e.g., electronic systems), in accordance with embodiments of the disclosure, include a stack of vertically alternating conductive structures and insulative structures arranged in tiers, through which pillars vertically extend. The stack is sub-divided, by elongate slit structures, into blocks of the pillars. The relative spacing of the elongate slit structures is tailored according to expected pillar bending in the blocks, with the greater the expected pillar bending corresponding to the greater spacing of the elongate slit structures. By progressing the spacing of the elongate slits structures—and therefore progressing the widths of the blocks—in this manner, processing margin may be improved in that the slit structures may be formed (e.g., etched) with less risk of inadvertently etching away materials or features (e.g., conductive rails adjacent the pillars) intended to be disposed between the pillars and the slit structures and with less risk of inadvertently etching away portions of the pillars, themselves. Therefore, the structures (e.g., microelectronic device structures), apparatus (e.g., microelectronic devices), and systems (e.g., electronic systems) may be more reliably fabricated with less device failure.

As used herein, the term "progressively spaced," when referring to a series of features, means and includes the features being respectively spaced apart from one another, in at least one portion of such series, such that the lateral spacing of such features increases with increased lateral distance along the portion of the series, with a minimum amount of spacing at one end of the portion of the series and with a greatest amount of spacing at an opposite end of the portion of the series. In some embodiments, a "progressively spaced" series of features may have consistently increasing spacing throughout the portion of the series, with a direct correlation between the spacing and some other factor (e.g., number of such feature in the portion of the series). In other embodiments, a "progressively spaced" series of features may have otherwise increasing spacing throughout the portion of the series (e.g., with logarithmically increased spacing, with exponentially increased spacing, or some other increasing trend of spacing). Also, as used herein, the term "progressed spacing," when referring to the spacing of a series of features, means and includes such series of features having been progressively spaced.

As described herein, the "spacing" of a structure feature (e.g., a pattern feature, a slit structure) relative to another such structure is with respect to at one elevation containing such structures. For example, a series of slit structures may be progressively spaced with the "spacing" of such slit structures measured at a lower elevation (e.g., a lower surface), at an upper elevation (e.g., an upper surface), and/or some other elevation (e.g., a more mid-height horizontal cross-section), even if, at other elevations, the slit structures have other relative spacing to one another.

As used herein, the term "opening" means a volume extending through at least one structure or at least one material, leaving a gap in that at least one structure or at least one material, or a volume extending between structures or materials, leaving a gap between the structures or materials. Unless otherwise described, an "opening" is not necessarily empty of material. That is, an "opening" is not necessarily void space. An "opening" formed in or between structures or materials may comprise structure(s) or material(s) other than that in or between which the opening is formed. And, structure(s) or material(s) "exposed" within an opening is (are) not necessarily in contact with an atmosphere or non-solid environment. Structure(s) or material(s) "exposed" within an opening may be adjacent or in contact with other structure(s) or material(s) that is (are) disposed within the opening.

As used herein, the term "substrate" means and includes a base material or other construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, structures, or junctions in the base semiconductor structure or foundation.

As used herein, the term "insulative," when used in reference to a material or structure, means and includes a material or structure that is electrically insulating. An "insulative" material or structure may be formed of and include one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric carboxynitride material (e.g., a silicon carboxynitride ($SiO_xC_zN_y$)), and/or air. Formulae including one or more of "x," "y," and/or "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and/or "z" atoms of an additional element (if any), respectively, for every one atom of another element (e.g., Si, Al, Hf, Nb, Ti). As the formulae are representative of relative atomic ratios and not strict chemical structure, an insulative material or insulative structure may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "sacrificial," when used in reference to a material or structure, means and includes a material or structure that is formed during a fabrication process but which is removed (e.g., substantially removed) prior to completion of the fabrication process.

As used herein, the terms "horizontal" or "lateral" mean and include a direction that is parallel to a primary surface of the substrate on which the referenced material or structure is located. The width and length of a respective material or structure may be defined as dimensions in a horizontal plane. With reference to the figures, the "horizontal" direction may be perpendicular to an indicated "Z" axis, may be parallel to an indicated "X" axis, and may be parallel to an indicated "Y" axis.

As used herein, the terms "vertical" or "longitudinal" mean and include a direction that is perpendicular to a primary surface of the substrate on which a referenced material or structure is located. The height of a respective material or structure may be defined as a dimension in a vertical plane. With reference to the figures, the "vertical" direction may be parallel to an indicated "Z" axis, may be perpendicular to an indicated "X" axis, and may be perpendicular to an indicated "Y" axis.

As used herein, the term "width" means and includes a dimension, along a horizontal plane (e.g., at a certain elevation, if identified), defining a maximum distance, along such plane, of the material or structure in question. For example, a "width" of a structure, that is at least partially hollow, is the horizontal dimension between outermost edges or sidewalls of the structure, such as an outer diameter for a hollow, cylindrical structure.

As used herein, the terms "thickness" or "thinness" mean and include a dimension in a straight-line direction that is normal to the closest surface of an immediately adjacent material or structure that is of a different composition or that is otherwise distinguishable from the material or structure whose thickness, thinness, or height is discussed.

As used herein, the term "between" is a spatially relative term used to describe the relative disposition of one material, structure, or sub-structure relative to at least two other materials, structures, or sub-structures. The term "between" may encompass both a disposition of one material, structure, or sub-structure directly adjacent the other materials, structures, or sub-structures and a disposition of one material, structure, or sub-structure indirectly adjacent to the other materials, structures, or sub-structures.

As used herein, the term "proximate" is a spatially relative term used to describe disposition of one material, structure, or sub-structure near to another material, structure, or sub-structure. The term "proximate" includes dispositions of indirectly adjacent to, directly adjacent to, and internal to.

As used herein, the term "neighboring," when referring to a material or structure, means and refers to a next, most proximate material or structure of an identified composition or characteristic. Materials or structures of other compositions or characteristics than the identified composition or characteristic may be disposed between one material or structure and its "neighboring" material or structure of the identified composition or characteristic. For example, a structure of material X "neighboring" a structure of material Y is the first material X structure, e.g., of multiple material X structures, that is next most proximate to the particular structure of material Y. The "neighboring" material or structure may be directly or indirectly proximate the structure or material of the identified composition or characteristic.

As used herein, the term "consistent"—when referring to a parameter, property, or condition of one structure, material, feature, or portion thereof in comparison to the parameter, property, or condition of another such structure, material, feature, or portion of such same aforementioned structure, material, or feature—means and includes the parameter, property, or condition of the two such structures, materials, features, or portions being equal, substantially equal, or about equal, at least in terms of respective dispositions of such structures, materials, features, or portions. For example, two structures having "consistent" thickness as one another may each define a same, substantially same, or about the same thickness at X vertical distance from a feature, despite the two structures being at different elevations along the feature. As another example, one structuring having a "consistent" width may have two portions that each define a same, substantially same, or about the same width at elevation Y1 of such structure as at elevation Y2 of such structure.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0% met, at least 95.0% met, at least 99.0% met, or even at least 99.9% met.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "level" and "elevation" are spatially relative terms used to describe one material's or feature's relationship to another material(s) or feature(s) as illustrated in the figures, using—as a reference point—the primary surface of the substrate on which the reference material or structure is located. As used herein, a "level" and an "elevation" are each defined by a horizontal plane parallel to the primary surface. "Lower levels" and "lower elevations" are nearer to the primary surface of the substrate, while "higher levels" and "higher elevations" are further from the primary surface. Unless otherwise specified, these spatially relative terms are intended to encompass different orientations of the materials in addition to the orientation as depicted in the figures. For example, the materials in the figures may be inverted, rotated, etc., with the spatially relative "elevation" descriptors remaining constant because the referenced primary surface would likewise be respectively reoriented as well.

As used herein, the terms "comprising," "including," "having," and grammatical equivalents thereof are inclusive or open-ended terms that do not exclude additional, unrecited elements or method steps, but these terms also include more restrictive terms "consisting of" and "consisting essentially of" and grammatical equivalents thereof. Therefore, a structure described as "comprising," "including," and/or "having" a material may be a structure that, in some embodiments, includes additional material(s) as well and/or a structure that, in some embodiments, does not include any other material(s). Likewise, a composition (e.g., gas) described as "comprising," "including," and/or "having" a species may be a composition that, in some embodiments, includes additional species as well and/or a composition that, in some embodiments, does not include any other species.

As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, "and/or" means and includes any and all combinations of one or more of the associated listed items.

As used herein, the singular forms "a," "an," and "the" are intended to include the plural forms as well, unless the context clearly indicates otherwise.

As used herein, a "(s)" at the end of a term means and includes the singular form of the term and/or the plural form of the term, unless the context clearly indicates otherwise.

As used herein, the terms "configured" and "configuration" mean and refer to a size, shape, material composition, orientation, and arrangement of a referenced material, structure, assembly, or apparatus so as to facilitate a referenced operation or property of the referenced material, structure, assembly, or apparatus in a predetermined way.

The illustrations presented herein are not meant to be actual views of any particular material, structure, sub-structure, region, sub-region, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or structures as illustrated but may include deviations in shapes that result, for example, from manufacturing techniques. For example, a structure illustrated or described as box-shaped may have rough and/or nonlinear features. Moreover, sharp angles that are illustrated may be rounded. Thus, the materials, features, and structures illustrated in the figures are schematic in nature and their shapes are not intended to illustrate the precise shape of a material, feature, or structure and do not limit the scope of the present claims.

The following description provides specific details, such as material types and processing conditions, in order to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

In referring to the drawings, like numerals refer to like components throughout. The drawings are not necessarily drawn to scale.

With reference to FIG. 1, schematically illustrated is a top plan view of a deck (e.g., a lower deck 102) of a microelectronic device structure. The deck (e.g., the lower deck 102) includes a series of slit structures 104 (e.g., filled slots, filled trenches) that sub-divide the lower deck 102 into a series of blocks 106 (e.g., from about a center of one of the slit structures 104 to the center of a neighboring one of the slit structures 104). Within each of the blocks 106 is an array of pillars 108 (e.g., pillars forming portions of vertical strings of memory cells), illustrated in simplified horizontal cross-section.

In at least one portion of the deck (e.g., the lower deck 102), the slit structures 104 are progressively spaced. In this progressed area 110, the lateral spacing of the slit structures 104 may increase, with decreasing lateral distance toward an adjacent portion 112 (e.g., along line 114), according to the following formula:

$$W = X + NS$$

wherein:
  W represents the lateral (e.g., X-axis) width, from lateral center to lateral center, of neighboring slit structures 104, and therefore a width of the intervening block 106;
  X represents a reference width (e.g., a nominal width);
  N represents the numerical order number, of the intervening block 106, in the respective portion of the series of blocks 106 from an outer end of the respective portion of the series, beginning with zero (0) (or, in some embodiments, one (1)); and
  S represents a predefined width-increase value.

Accordingly, as illustrated in FIG. 1, when the progressed area 110 includes, in each of a left portion 116 and a right portion 118, seven blocks 106 including a block with a minimum width of the nominal width X, then the width of the blocks 106 in the left portion 116 increase, from furthest from the adjacent portion 112 (e.g., furthest from line 114) to nearest the adjacent portion 112 (e.g., nearest the line 114), from a minimum X, to X+1S, to X+2S, to X+3S, to X+4S, to X+5S, to X+6S. Correspondingly, in the right portion 118, the widths of the blocks 106 increase, from furthest from the adjacent portion 112 (e.g., furthers from the line 114) to nearest the adjacent portion 112 (e.g., nearest the line 114), from the minimum X, to X+1S, to X+2S, to X+3S, to X+4S, to X+5S, to X+6S. Thus, in the progressed area 110 the widest spacing of the slit structures 104, and therefore the widest blocks 106, are proximate the adjacent portion 112, while the narrowest spacing of the slit structures 104, and therefore the narrowest blocks 106, are distal from the adjacent portion 112.

As a comparison, relative to a hypothetical arrangement of the slit structures 104 with consistently even spacing across a deck, the blocks 106 of the progressed area 110 of the left portion 116 may be considered as having been shifted more leftward (e.g., in the negative X-axis direction)

a decreasing amount from a maximum nearest to the adjacent portion 112 to a minimum furthest from the adjacent portion 112. Likewise, in the respective right portion 118 of the progressed area 110, the blocks 106 may be considered as having been shifted rightward (e.g., in the positive X-axis direction)—from a hypothetical arrangement with consistently-even spacing—a decreasing amount from a maximum nearest the adjacent portion 112 to a minimum furthest from the adjacent portion 112.

Outside of the progressed area 110, the blocks 106 of the deck (e.g., the lower deck 102) may be consistently evenly spaced, such as at the nominal spacing of X, as illustrated in FIG. 1.

Though the progressed spacing of the slit structures 104 results in the respective blocks 106 in the progressed area 110 also being progressively wider with decreased lateral distance to the adjacent portion 112, the widths of the arrays of the pillars 108 within each respective block may be substantially constant from block 106 to block 106. Therefore, the wider blocks 106 may have a greater rail width 120 to at least one lateral side of its respective array of pillars 108 than at least one rail width 120 to at least one lateral side of a respective array of pillars 108 in a narrower block 106. For example, for the widest block 106 of the right portion 118 of the progressed area 110 illustrated in FIG. 1 (e.g., the block 106 with width X+6S) the rail width 120 on either or both lateral sides of the pillars 108 may be greater than the rail width 120 on either or both lateral sides of the pillars 108 in the next widest block 106 of the right portion 118 of the progressed area 110 (e.g., the block with width X+5S).

With reference to FIG. 2, an elevational, cross-sectional, schematic illustration of a microelectronic device structure 200 that includes such a deck as the lower deck 102 of FIG. 1 reflects the potential benefits of the progressed spacing of the slit structures 104, and therefore the progressed widths of the blocks 106 while maintaining a substantially consistent width of the array of pillars 108 within each of the blocks 106.

The microelectronic device structure 200 includes at least one stack structure 202, formed on or otherwise supported by at least one base structure(s) 204. The base structure(s) 204, below the stack structures 202 (e.g., below the lower deck 102), may include one or more substrates or other base materials (e.g., polysilicon structure(s), conductive structure(s)). For example, in some embodiments, the stack structures 202 (and the decks, including the lower deck 102) may be formed over a source material that may be formed of and include, e.g., a semiconductor material doped with one of P-type conductivity materials (e.g., polysilicon doped with at least one P-type dopant (e.g., boron ions)) or N-type conductive materials (e.g., polysilicon doped with at least one N-type dopant (e.g., arsenic ions, phosphorous ions, antimony ions)).

In some embodiments, the microelectronic device structure 200 may be a multi-deck structure with one of the stack structures 202 providing the lower deck 102 and an additional one of the stack structures 202 providing an upper deck 206 above the lower deck 102. In some embodiments, three or more such decks may be stacked to provide a microelectronic device structure.

The slit structures 104 and the pillars 108 extend through the stack structures 202. In some embodiments, each of the slit structures 104 extends continuously through the stack structures 202 of all decks (e.g., the upper deck 206, the lower deck 102) of the microelectronic device structure 200. A lower array of the pillars 108 may extend through the lower deck 102, and an upper array of the pillars 108 may extend through the upper deck 206. Respective, vertically-adjacent neighbors of the pillars 108 may align (e.g., be in physical contact) with one another along an interface 208 between the lower deck 102 and the upper deck 206.

Due to inherent limitations of microelectronic device fabrication, such as residual material stresses in neighboring features or regions of the microelectronic device structure 200, some of the pillars 108 formed in the stack structures 202 may exhibit pillar bending, e.g., leaning or curving away from a true vertical orientation of the pillar 108. Bending of the pillars 108 may be more pronounced in some areas of the microelectronic device structure 200 than in others, such as in regions near the adjacent portion 112 (e.g., nearest line 114). Accordingly, the pillars 108 of the blocks 106 nearest the adjacent portion 112 may exhibit a greater amount of bending than the pillars 108 of the blocks 106 further away from the adjacent portion 112. The amount of bending may progressively decrease with increasing lateral distance from the adjacent portion 112.

The arrangement of the slit structures 104, and particularly the above-discussed progressive spacing of the slit structures 104 (and the progressive widening of the blocks 106 in the progressed area 110), may be tailored according to the bending exhibited by the pillars 108, with the widths being widths sufficient to enable the slit structures 104 to be formed through the stack structure 202 without etching into the pillars 108 and while ensuring at least a portion of the material of the stack structure 202 remains interposed between each of the slit structures 104 and the pillars 108 of the block 106 bordered by the slit structure 104. In those blocks 106 with pillars 108 bending to a lesser degree, such as the block 106 with width X+4S, illustrated in FIG. 2, the narrowest rail width 120 may be greater than the narrowest rail width 120 of the blocks 106 with pillars 108 bending to a greater degree. In blocks 106 having pillars 108 not exhibiting any or substantial bending, the width of the blocks 106 may be minimal (e.g., nominal width X), with a consistent rail width 120 on both lateral sides of the block 106 through substantially all elevations of the block 106.

As an example, in some embodiments, a neighboring pair of the slit structures 104 may be widest spaced where the pillars 108 of the array of the intervening block 106 exhibit the most bending (e.g., nearest the adjacent portion 112). By configuring the arrangement of the slit structures 104 in accordance with the expected bending of the pillars 108, the slit structures 104 may be positioned sufficiently wide enough apart, and sufficiently laterally spaced from the outermost pillars 108 of the respective pillar array, to ensure at least some amount of stack structure 202 material remains adjacent the bent pillars 108 and the slit structure 104 when the slit structure 104 is formed. Thus, as illustrated with the block 106 of width X+6S in the right portion 118 of the progressed area 110, at least some rail width 120 separates the pillar 108 nearest the adjacent portion 112 from the slit structure 104 on that side of the block 106. On the opposite lateral side of the block 106, the rail width 120 may be significantly greater, in embodiments in which the pillars 108 bend toward the adjacent portion 112.

In embodiments in which the microelectronic device structure (e.g., the microelectronic device structure 200 of FIG. 2) includes multiple decks, the pillars 108 may exhibit bending in the same or different directions, relative to the adjacent portion 112, in the lower deck 102 compared to the upper deck 206. For example, as illustrated in FIG. 2, the pillars 108 of the lower deck 102 may bend away from the adjacent portion 112 (e.g., away from line 114), while the pillars 108 of the upper deck 206 may bend toward the adjacent portion 112 (e.g., toward line 114). In other embodiments, the pillars 108 of the lower deck 102 may bend toward the adjacent portion 112 (e.g., toward line 114) while the pillars 108 of the upper deck 206 may bend away from the adjacent portion 112 (e.g., away from line 114). In still other embodiments, both the pillars 108 of the lower deck 102 and of the upper deck 206 may bend in the same respective direction, such as both toward the adjacent portion 112 (e.g., toward line 114), both away from the adjacent portion 112 (e.g., away from line 114). In yet other embodiments, the pillars 108 of fewer than all of the decks may exhibit bending, either toward or away from the adjacent portion 112 (e.g., toward or away from the line 114), while the pillars 108 of remaining one or more of the decks do not exhibit bending.

In some embodiments in which the microelectronic device structure (e.g., the microelectronic device structure 200 of FIG. 2) includes multiple decks, the pillars 108 of one or more of the decks may exhibit a greater amount of bending than vertically adjacent pillars 108 of one or more others of the decks. For example, as illustrated in FIG. 2, the pillars 108 of the upper deck 206 may exhibit a greater degree of bending toward the adjacent portion 112 (e.g., toward the line 114) than the degree of bending away from the adjacent portion 112 (e.g., away from the line 114) exhibited by the pillars 108 of the lower deck 102. In other embodiments, the pillars 108 of the lower deck 102 may exhibit a greater degree of bending than the degree of bending exhibited by the pillars 108 of the upper deck 206. In still other embodiments, the pillars 108 of both the lower deck 102 and the upper deck 206 may exhibit substantially the same degree of bending. Accordingly, while FIG. 1 and FIG. 2 illustrate the rail widths 120 along the top elevation of the lower deck 102 (e.g., along the interface 208) as being substantially even on both lateral sides of an array of pillars 108 of a given one of the blocks 106, in other embodiments with differing degrees of pillar bending, the rail widths 120 along the upper surface of the lower deck 102 may be uneven, comparing the rail width 120 on the left lateral side of the pillar array of the block 106 to the right lateral side of the pillar array of the block 106.

Accordingly, the direction and amount of bending of the pillars 108, and the comparative amount of the rail width 120 on the left and right lateral sides of the blocks 106 (e.g., to left and right lateral sides of each of the arrays of pillars 108) may be different than as illustrated, without departing from the scope of this disclosure. Nonetheless, the degree of bending of the pillars 108 may be greatest nearest the adjacent portion 112 (e.g., nearest the line 114) and least furthest from the adjacent portion 112 (e.g., furthest from the line 114), such that the slit structures 104 being progressively spaced, from greatest spacing proximate the adjacent portion 112 (e.g., proximate the line 114) to nearest spacing distal from the adjacent portion 112 (e.g., distal from the line 114)—and, therefore, progressive widths of the blocks 106 in the same greatest-to-narrowest trend—accommodates the bending of the pillars 108 while ensuring at least a minimal rail width 120 remains interposed between the pillars 108 and a neighboring one of the slit structures 104.

Accordingly, disclosed is a microelectronic device comprising a stack structure. The stack structure comprises a vertically alternating sequence of insulative structures and conductive structures arranged in tiers. A series of slit structures extends through the stack structure and divides the stack structure into a series of blocks. In a progressed portion of the series of blocks, each block comprises an array of pillars and a different block width than a block width of a neighboring block of the progressed portion of the series of blocks. The array of pillars extends through the stack structure of the block. At least one pillar, of the array of pillars in the progressed portion, exhibits bending.

The bending exhibited by the pillars 108 in the widest blocks 106 may be effected by neighboring features or materials, or by the absence of neighboring features or materials, e.g., represented by the adjacent portion 112 (e.g., and by line 114) of FIG. 2. For example, with reference to FIG. 3, illustrated is a possible adjacent portion 112 that may be disposed between the left portion 116 and the right portion 118 of the microelectronic device structure 200 (FIG. 2) (and therefore between a left portion and a right portion of the progressed area 110). The illustrated adjacent portion 112 includes another array of pillars 108 between the line 114—which may represent a centerline of the progressed area 110—and each of the innermost slit structures 104. The pillars 108 of these innermost arrays may exhibit the greatest amount of pillar bending compared to other pillars 108 within the progressed area 110. Proximate the line 114 may be an array of contacts 302 (e.g., active contacts, support contacts, bit line contacts), wherein the line 114 may also represent a centerline of the array of contacts 302. It may be the proximity of the contacts 302 that effects the pillars 108 exhibiting a greater amount of bending proximate the adjacent portion 112 than the bending exhibited by pillars 108 more distal from the adjacent portion 112.

While FIG. 3 illustrates an array of contacts 302 that is four contacts 302 wide, the disclosure is not so limited. The number and arrangement of the contacts 302 may be otherwise varied, in other embodiments, and the remainder of the microelectronic device structure 200 be as discussed above.

In other embodiments, the adjacent portion 112 may represent the absence of additional features or materials. For example, rather than present an additional material- or structure-including portion of the progressed area 110, the adjacent portion 112 may include the edge of the series of the blocks 106 and/or the end of the series of arrays of pillars 108, which edge may be represented by line 114. In the absence of additional materials or structures in the adjacent portion 112, the neighboring pillars 108 may exhibit the pillar bending, as discussed above, with the bending amount lessening with increased lateral distance from the adjacent portion 112 and from the line 114. In such embodiments, the progressed area 110 may include only one of the left portion 116 or the right portion 118. Nonetheless, the progressed area 110 includes at least one portion with a series of blocks 106, having arrays of pillars 108, with the blocks 106 being progressively narrowed—and with the respective slit structures 104 being progressively spaced nearer to neighboring slit structures 104—with increased lateral distance from the adjacent portion 112 (and from the line 114).

The bending of the pillars 108—such as the degree of bending and the lateral area exhibiting pillar bending—may be impacted by the materials or structures within the adjacent portion 112 (or the lack of materials or structures within the adjacent portion 112). Therefore, the pillar bending exhibited in one general area of a device structure may be different than the pillar bending in another general area of the device structure if the materials or structures in their respective adjacent portion 112 are different from one another. For example, the pillars 108 proximate a first adjacent portion 112 in the form of an outer edge of a device may exhibit greater amounts of pillar bending over a greater lateral distance than, e.g., the pillars 108 proximate a second adjacent portion 112 in the form of the array of contacts 302 illustrated in FIG. 3. Therefore, the progressed area 110 selected for the first adjacent portion 112 may be larger (e.g., wider) and include a greater number of blocks 106 and slit structures 104 than the progressed area 110 selected for the second adjacent portion 112.

Moreover, the other parameters selected for defining the progressive spacing of the slit structures 104, and therefore the progressive widths of the blocks 106, may also be tailored according to the particular pillar bending of the affected area, in light of the particular adjacent portion 112. For example, the predefined width-increase value S, for defining the widths of the various blocks 106 of the progressed area 110 (and therefore for defining the spacing of the various slit structures 104 of the progressed area 110), may be selected in light of expected rate of change of pillar bending across a respective portion of the progressed area 110. For example, in regions of a device where pillar bending amount varies more drastically, between a minimum amount and a maximum amount of bending, over a shorter lateral area, the width-increase value used for progressively spacing slit structures 104 (and therefore for progressively widening blocks 106) in that region may be greater than the width-increase value S used in other regions of the device where pillar bending variations are more gradual across a lateral distance. For example, in some areas of a device-adjacent a first adjacent portion 112, the slit structures 104 may be progressively spaced in one progressed area 110, and the respective blocks 106 progressively widened, using a predefined width-increase value S of less than 0.1 nm per slit structure 104 while in other areas of the device, another progressed area 110 may progressively space slit structures 104 (and progressively widen blocks 106) using a predefined width-increase value S of greater than 0.1 nm per slit structure. Accordingly, the predefined width-increase value S may be tailored according to expected pillar bending, such as from past empirical data (e.g., past observations of pillar bending from building microelectronic devices with microelectronic device structures), in light of the particular features and materials (or the lack of features or materials) in the respective adjacent portion 112.

The number of blocks 106 to be included in a respective portion (e.g., the left portion 116, the right portion 118) of a progressed area 110 may be selected according to the expected bending of the pillars 108, in light of the respective adjacent portion 112. For example, from past empirical data (e.g., past observations from building microelectronic device structures), one may expect that, e.g., more than ten (e.g., twenty, thirty, forty, fifty, or more, or any other number greater than one) blocks 106 in a portion (e.g., the left portion 116, the right portion 118) of a microelectronic device structure (e.g., the microelectronic device structure 200 of FIG. 2) will exhibit bending in the vicinity of a particular adjacent portion 112 (e.g., an edge region of the device structure, a region adjacent an extensive array of contacts 302, a region adjacent a lesser array of contacts 302). Accordingly, the progressed area 110 may include that number of blocks 106, in a portion of or in total of the progressed area 110, depending on the previous empirical data. For example, in some embodiments, the progressed area 110 may include a predetermined number between twenty and fifty for the number of blocks 106 to be progressively widened in the left portion 116 of the progressed area 110 and corresponding (e.g., equal) number between the twenty and fifty for the number of blocks 106 to be progressively widened in the right portion 118 of the progressed area 110. Accordingly, while FIG. 1 and FIG. 2 illustrate seven blocks 106 within each respective portion (e.g., the left portion 116, the right portion 118) of the progressed area 110 (such that the maximum block 106 width is X+6S), the disclosure is not so limited. Moreover, it will be recognized that, because each of the blocks 106 is bordered by a pair of the slit structures 104, if a portion (e.g., left portion 116, right portion 118) of the progressed area 110 has a total number of "B" blocks 106, then the total number of slit structures 104 of that portion of the progressed area 110 will be B+1.

The parameters (e.g., the reference, or nominal, width X, the total number of blocks 106 to be included in the respective portion of the progressed area 110, and/or the predefined width-increase value S) for defining the progressive widths of the blocks 106 and the progressive spacing of the slit structures 104 may also be selected to according to a preselected maximum width for the blocks 106 (and therefore a maximum spacing of the slit structures 104) and/or a minimum width for the blocks 106 (and therefore a minimum spacing of the slit structures 104). For example, in some embodiments, a maximum width for one of the blocks 106 in the progressed area 110 (e.g., maximum of X+NS) may be selected to be between about 1.75 nm and about 6 nm. In these or other embodiments, a minimum width for one of the blocks 106 in the progressed area 110 (e.g., minimum of X) may be selected to be less than about 0.1 nm.

Accordingly, the number of progressively widened blocks 106 (and therefore the number of progressively spaced slit structures 104), the lateral area of the progressed area 110, and the magnitude of change of the progressive widening or spacing may all be tailored in light of, e.g., previously observed pillar bending, and each may also be tailored in light of the features and materials, or lack of features and materials, that are to occupy the adjacent portion 112 laterally beside at least one portion of the progressed area 110.

In some embodiments, in which the blocks 106 are formed on multiple lateral sides of the adjacent portion 112, the progressed area 110 may have progressive spacing of the slit structures 104 and therefore progressive widths of the blocks 106 that is substantially symmetrical about the adjacent portion 112 (e.g., about the line 114). In other embodiments, the progression of slit structure 104 spacing and the progression of block 106 widths on one lateral side of the adjacent portion 112 (e.g., the left portion 116) may not be substantially symmetrical to that on an opposite, lateral side of the adjacent portion 112 (e.g., the right portion 118). In still other embodiments, such as those in which the adjacent portion 112 includes an edge of a device structure as the line 114, the progressed area 110 may be wholly to only one lateral side of the adjacent portion 112 and include only one minimum-to-maximum progression of slit structure 104 spacing and block 106 widths.

Figure 4:
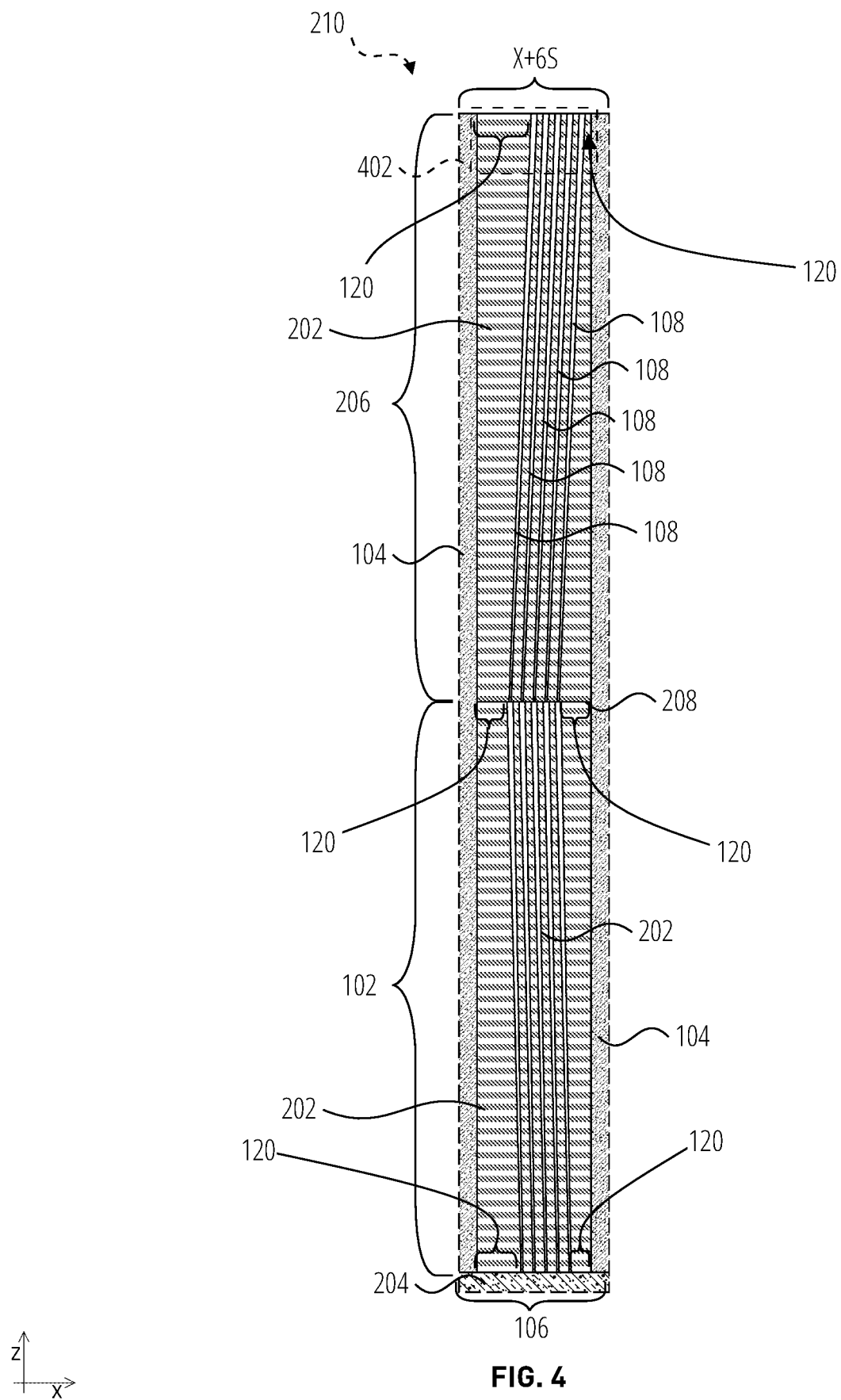
FIG. 4 is a cross-sectional, elevational, schematic, enlarged illustration of a block from the microelectronic device structure of FIG. 2, the illustrated block corresponding to the dashed-lined, boxed portion of FIG. 2.

FIG. 4 illustrates, in an enlarged schematic, one of the blocks 106 of the microelectronic device structure 200 of FIG. 2, e.g., the X+6S width block 106 of the left portion 116 of the progressed area 110 (see area in box 210 of FIG. 2). In some embodiments, such as that illustrated in FIG. 4, each of the pillars 108 may taper in width—from maximum transverse width to minimum transverse width—with increased vertical distance toward the base structure(s) 204, respective to the deck through which the pillar 108 extends. For example, the pillars 108 of the upper deck 206 may taper from a maximum width adjacent an upper surface of the upper deck 206 to a minimum width adjacent a lower surface of the upper deck 206, adjacent the interface 208; and, the pillars 108 of the lower deck 102 may taper from a maximum width adjacent an upper surface of the lower deck 102, adjacent the interface 208, to a minimum width adjacent a lower surface of the lower deck 102, adjacent the base structure(s) 204.

Depending on the amount (e.g., degree) and direction of bending exhibited by the pillars 108, if any such bending is exhibited, the rail widths 120 may differ at various elevations of the decks. Nonetheless, the pacing of the slit structures 104, and therefore the width of the blocks 106, may be tailored to ensure that at least a minimum rail width 120 remains—at least when openings are formed (e.g., etched) for the slit structures 104—laterally adjacent an outermost one of the pillars 108, between such one of the pillars 108 and the respective, neighboring one of the slit structures 104. For clarity, the area indicated by box 402, of FIG. 4, is shown in an enlarged illustration in FIG. 5.

Figure 5:
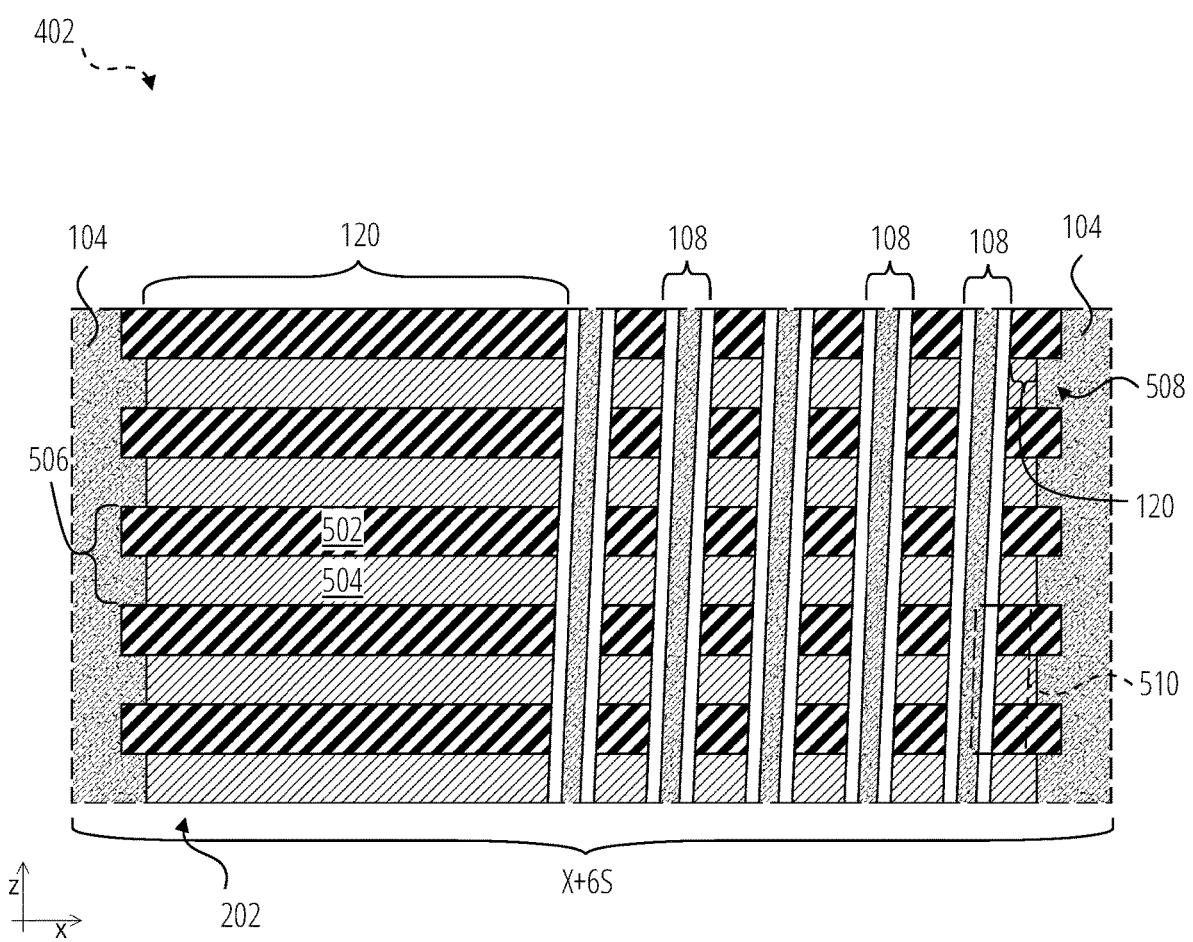
FIG. 5 is a cross-sectional, elevational, schematic, enlarged illustration of a portion of the block from FIG. 4, the illustrated portion corresponding to the dashed-line, boxed portion of FIG. 4.

As illustrated in FIG. 5, the stack structure 202, through which the pillars 108 extend, includes a sequence of insulative structures 502 and conductive structures 504 vertically alternating with one another through a height of the stack structure 202. The insulative structures 502 and the conductive structures 504 are arranged in tiers 506.

In some embodiments, the conductive structures 504 may be recessed relative to their neighboring insulative structures 502. For example, there may be recesses 508 laterally adjacent one or more ends of the conductive structures 504, and the slit structures 104 may laterally extend between ends of the insulative structures 502. In other embodiments, the ends of some or all of the insulative structures 502 may align with (e.g., be substantially coplanar with) the ends of some or all of the conductive structures 504.

As discussed further below with regard to box 510, the presence of the conductive structures 504 adjacent the pillars 108 enables each of the pillars 108 to provide a string of memory cells. The progressive spacing of the slit structures 104, and therefore the progressive widths of the blocks 106 (FIG. 4), is configured to ensure at least a minimal portion of the conductive structure 504 remains interposed between the outermost of the pillars 108 and the adjacent one of the slit structures 104, even when the pillar 108 exhibits a significant amount of bending toward the slit structure 104. Therefore, even pillars 108 exhibiting a significant amount of bending may still provide operable memory cells for the apparatus. Thus, pillar bending may be accommodated, by the progressed spacing of the slit structures 104 and the progressed widths of the blocks 106.

For example, as illustrated in FIG. 5, for example, there is at least a minimal rail width 120, of the uppermost illustrated conductive structure 504, between the right-most illustrated pillar 108 and the right-most illustrated slit structure 104. The rail width 120 on the opposite side of the block 106 (FIG. 4), e.g., between the left-most illustrated pillar 108 and the left-most illustrated slit structure 104, is significantly wider than the aforementioned right-side rail width 120. Nonetheless, the tailored, progressed spacing of the slit structures 104, and therefore the tailored, progressed width for this particular block 106 (e.g., the width of X+6S) enables the slit structures 104 to be formed without removing any portion of the pillars 108 and while leaving a sufficient width (e.g., at least a minimum rail width 120) of the conductive structures 504 between the pillars 108 and the slit structures 104.

Though the illustrated stack structure 202 is of an upper portion of the upper deck 206, the illustration of FIG. 5 may equally apply to any other stack structure 202 portion—e.g., in the upper deck 206, in the lower deck 102, and/or in another deck—of a microelectronic device structure, in accordance with embodiments of the disclosure, such as in the microelectronic device structure 200 of FIG. 2, with the exception that the illustrated angled orientation of the pillars 108 may be different (e.g., more bent, less bent, not bent) in different portions of the stack structure 202.

FIG. 6A through FIG. 6D illustrate, in enlarged views, memory cells 602 (e.g., memory cell 602' of FIG. 6A, memory cell 602" of FIG. 6B, memory cell 602''' of FIG. 6C, and memory cell 602'''' of FIG. 6D) of a microelectronic device structure (e.g., the microelectronic device structure 200 of FIG. 2), in accordance with some embodiments of the disclosure. Each of the illustrations of FIG. 6A through FIG. 6D may represent a simplified enlarged view of box 510 of FIG. 5, though without illustrating the pillar bending, for ease of illustration and discussion. Reference to one "memory cell 602" or multiple "memory cells 602" equally refer to one or multiple of any of the illustrated memory cells 602 of FIG. 6A through FIG. 6D (e.g., memory cell 602' of FIG. 6A, memory cell 602" of FIG. 6B, memory cell 602''' of FIG. 6C, and memory cell 602'''' of FIG. 6D).

As illustrated in each of FIG. 6A through FIG. 6D, the memory cells 602 are in the vicinity of at least one tier 506, with at least one of the insulative structures 502 vertically adjacent an other structure 604 (e.g., the conductive structure 504) that is formed of and includes conductive material(s) 606.

The insulative structures 502 may be formed of and include at least one electrically insulative material, such as one or more of the insulative material(s) discussed above (e.g., a dielectric oxide material, such as silicon dioxide). The insulative material(s) of the insulative structures 502 may be the same or different than other insulative material(s) of the memory cell 602 and/or of the microelectronic device structure (e.g., the microelectronic device structure 200 of FIG. 2).

The other structures 604 may be formed of and include at least one material of a different composition than the neighboring insulative structures 502. For example, the other structures 604 may be formed of and include one or more conductive material(s) 606, such as a conductive metal-based material (as described further below, e.g., in embodiments in which the microelectronic device structure (e.g., the microelectronic device structure 200 of FIG. 2) is formed via a so-called "replacement gate" process), or such as a conductive semiconductor-based material (as described further below, e.g., in embodiments in which the microelectronic device structure (e.g., the microelectronic device structure 200 of FIG. 2) is formed in a so-called "floating gate" configuration).

Adjacent the tiers 506 with the insulative structures 502 and the other structures 604 (e.g., the conductive structures 504) are materials of the pillar 108, including cell material(s) 608 and an insulative material 610. The cell material(s) 608 include at least a channel material 612. The channel material 612 may be horizontally interposed between the insulative material 610 and the tiers 506 of the stack structure 202 (FIG. 2).

The insulative material 610 may be formed of and include an electrically insulative material such as, for example, phosphosilicate glass (PSG), borosilicate glass (BSG), fluorosilicate glass (FSG), borophosphosilicate glass (BPSG), silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), a dielectric carbon nitride material (e.g., silicon carbon nitride (SiCN)), a dielectric carboxynitride material (e.g., silicon carboxynitride (SiOCN)), or combinations thereof. In some embodiments, the insulative material 610 comprises silicon dioxide.

The channel material 612 may be formed of and include one or more of a semiconductor material (at least one elemental semiconductor material, such as polycrystalline silicon; at least one III-V compound semiconductor material, at least one II-VI compound semiconductor material, at least one organic semiconductor material, GaAs, InP, GaP, GaN, other semiconductor materials), and an oxide semiconductor material. In some embodiments, the channel material 612 includes amorphous silicon or polysilicon. In some embodiments, the channel material 612 comprises a doped semiconductor material. The insulative material 610 may be horizontally adjacent the channel material 612.

Figure 6A:
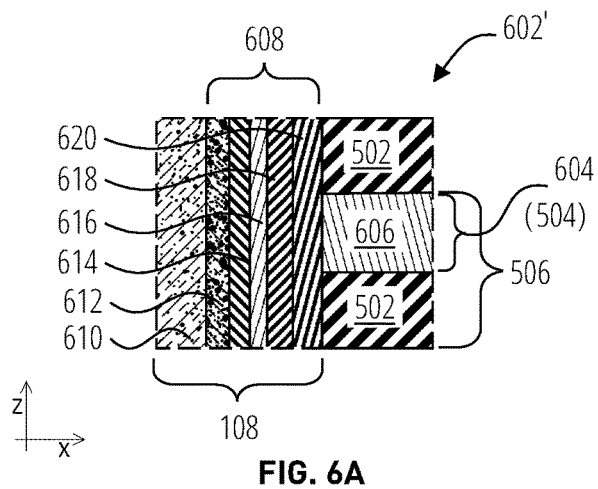
FIG. 6A through FIG. 6D are cross-sectional, elevational, schematic illustrations of memory cells, in accordance with embodiments of the disclosure, the illustrated areas each corresponding to, e.g., the dashed-lined, boxed portion of FIG. 5.

In some embodiments, such as that of FIG. 6A, the cell material(s) 608 of the memory cell 602' also include a tunnel dielectric material 614 (also referred to as a "tunneling dielectric material"), which may be horizontally adjacent the channel material 612; a memory material 616, which may be horizontally adjacent the tunnel dielectric material 614; a dielectric blocking material 618 (also referred to as a "charge blocking material"), which may be horizontally adjacent the memory material 616; and a dielectric barrier material 620, which may be horizontally adjacent the dielectric blocking material 618.

The tunnel dielectric material 614 may be formed of and include a dielectric material through which charge tunneling can be performed under suitable electrical bias conditions, such as through hot-carrier injection or by Fowler-Nordheim tunneling induced charge transfer. The tunnel dielectric material 614 may be formed of and include one or more of silicon oxide, silicon nitride, silicon oxynitride, dielectric metal oxides (e.g., aluminum oxide and hafnium oxide), dielectric metal oxynitride, dielectric metal silicates, alloys thereof, and/or combinations thereof. In some embodiments, the tunnel dielectric material 614 comprises silicon dioxide or silicon oxynitride.

The memory material 616 may comprise a charge trapping material or a conductive material. The memory material 616 may be formed of and include one or more of silicon nitride, silicon oxynitride, polysilicon (e.g., doped polysilicon), a conductive material (e.g., tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material polycrystalline or amorphous semiconductor material including at least one elemental semiconductor element or at least one compound semiconductor material, conductive nanoparticles (e.g., ruthenium nanoparticles), metal dots. In some embodiments, the memory material 616 comprises silicon nitride.

The dielectric blocking material 618 may be formed of and include a dielectric material such as, for example, one or more of an oxide (e.g., silicon dioxide), a nitride (e.g., silicon nitride), and an oxynitride (e.g., silicon oxynitride), or another material. In some embodiments, the dielectric blocking material 618 comprises silicon oxynitride.

In some embodiments, the tunnel dielectric material 614, the memory material 616, and the dielectric blocking material 618 together may form a structure configured to trap a charge, such as, for example, an oxide-nitride-oxide (ONO) structure. In some such embodiments, the tunnel dielectric material 614 comprises silicon dioxide, the memory material 616 comprises silicon nitride, and the dielectric blocking material 618 comprises silicon dioxide.

The dielectric barrier material 620 may be formed of and include one or more of a metal oxide (e.g., one or more of aluminum oxide, hafnium oxide, zirconium oxide, lanthanum oxide, yttrium oxide, tantalum oxide, gadolinium oxide, niobium oxide, titanium oxide), a dielectric silicide (e.g., aluminum silicide, hafnium silicate, zirconium silicate, lanthanum silicide, yttrium silicide, tantalum silicide), and a dielectric nitride (e.g., aluminum nitride, hafnium nitride, lanthanum nitride, yttrium nitride, tantalum nitride).

In some embodiments of memory cells, such as with the memory cell 602' of FIG. 6A, the dielectric barrier material 620 may be horizontally adjacent one of the levels of the other structures 604 (e.g., one of the conductive structures 504) of one of the tiers 506 of the stack structure 202 (FIG. 2). The channel material 612 may be horizontally interposed between the insulative material 610 and the tunnel dielectric material 614; the tunnel dielectric material 614 may be horizontally interposed between the channel material 612 and the memory material 616; the memory material 616 may be horizontally interposed between the tunnel dielectric material 614 and the dielectric blocking material 618; the dielectric blocking material 618 may be horizontally interposed between the memory material 616 and the dielectric barrier material 620; and the dielectric barrier material 620 may be horizontally interposed between the dielectric blocking material 618 and the level of other structure 604 (e.g., the level of the conductive structure 504).

Figure 6B:
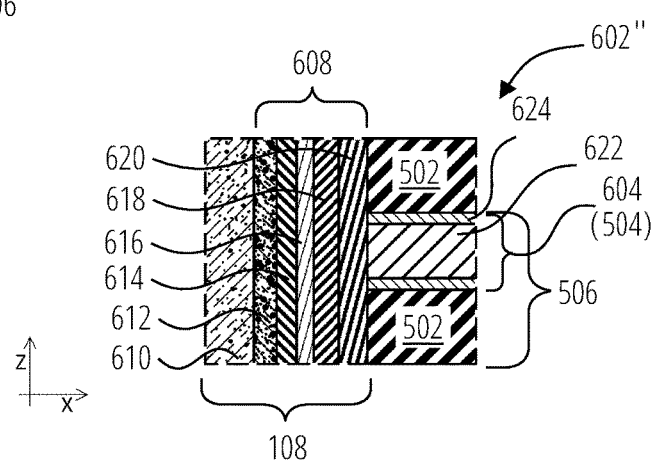

With reference to FIG. 6B, illustrated is a memory cell 602", in accordance with embodiments of the disclosure, wherein the microelectronic device structure (e.g., the microelectronic device structure 200 of FIG. 2) has been formed by a replacement gate process. One or more (e.g., all) the memory cells 602' of FIG. 6A may be replaced with the memory cell 602" of FIG. 6B. The memory cell 602" may include multiple conductive materials 606 (FIG. 6A) within the conductive structures 504 (e.g., within the other structures 604) of the tiers 506. For example, the conductive structures 504 may include a conductive material 622 within a conductive liner material 624. The conductive liner material 624 may be directly adjacent upper and lower surfaces of the insulative structures 502, and the conductive material 622 may be directly vertically between portions of the conductive liner material 624. The conductive liner material 624 may comprise, for example, a seed material that enables formation of the conductive material 622, during fabrication of the memory cell 602". The conductive liner material 624 may be formed of and include, for example, a metal (e.g., titanium, tantalum), a metal nitride (e.g., tungsten nitride, titanium nitride, tantalum nitride), or another material. In some embodiments, the conductive liner material 624 comprises titanium nitride, and the conductive material 622 comprises tungsten.

In other embodiments, the conductive liner material 624 is not included, and the conductive material 622 may be directly adjacent to, and in physical contact with, the insulative structures 502, such with the conductive material(s) 606 of the memory cell 602' of FIG. 6A, as discussed above.

Figure 6C:
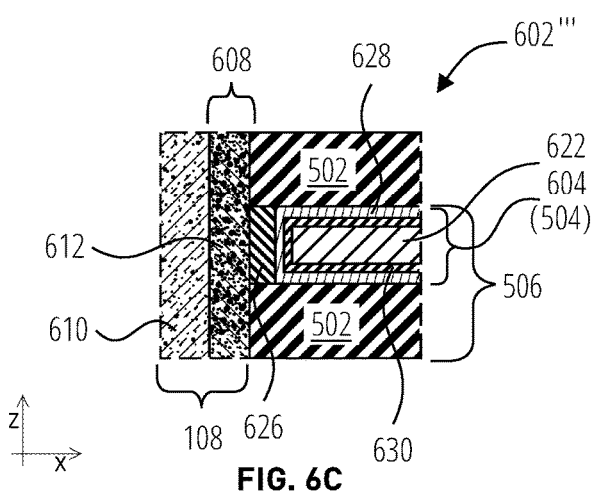

With reference to FIG. 6C, illustrated in simplified cross-section is a memory cell 602''', in accordance with additional embodiments of the disclosure. One or more (e.g., all) of the memory cell 602' of FIG. 6A and/or the memory cell 602" of FIG. 6B may be replaced with the memory cell 602''' of FIG. 6C. The memory cell 602''' may include the insulative material 610 and the channel material 612, as described above, and may further include a first dielectric material 626 (e.g., a tunnel dielectric material) horizontally adjacent the channel material 612. A second dielectric material 628 (e.g., a charge trapping material) may be horizontally adjacent the first dielectric material 626; and a third dielectric material 630 (e.g., a charge blocking material) may be horizontally adjacent the second dielectric material 628 and the conductive material 622. In some embodiments, the first dielectric material 626 comprises an oxide material (e.g., silicon dioxide), the second dielectric material 628 comprises a nitride material (e.g., silicon nitride), and the third dielectric material 630 comprises an oxide material (e.g., silicon dioxide). For clarity, in FIG. 6C, the conductive liner material 624 (FIG. 6B) is not illustrated around the conductive material 622; however, in some embodiments, the memory cell 602''' may further include such conductive liner material 624.

Figure 6D:
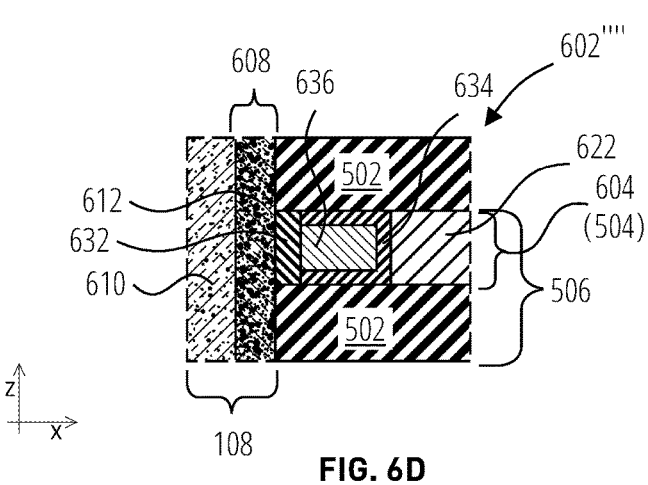

With reference to FIG. 6D, illustrated in simplified cross-section is a memory cell 602'''', in accordance with additional embodiments of the disclosure, wherein the memory cell 602'''' may be configured as a so-called "floating gate" memory cell. One or more (e.g., all) of the memory cell 602' of FIG. 6A, the memory cell 602'' of FIG. 6B, and/or the memory cell 602''' of FIG. 6C may be replaced with the memory cell 602'''' of FIG. 6D. In addition to the insulative material 610 and the channel material 612, the memory cell 602'''' may include an electrode structure 636, which may be referred to as a "floating gate." The electrode structure 636 may comprise an electrically conductive material, such as, e.g., polysilicon and/or one or more of the materials described with respect to conductive material 622 (e.g., tungsten). The memory cell 602'''' may further include a dielectric material 632, which may be referred to as a "gate dielectric" material. The dielectric material 632 may comprise, for example, one or more of the materials described above with reference to the tunnel dielectric material 614. In some embodiments, the dielectric material 632 comprises silicon dioxide. An other dielectric material 634 may be located around portions of the electrode structure 636. The other dielectric material 634 may comprise one or more of the materials described above with reference to the tunnel dielectric material 614. In some embodiments, the other dielectric material 634 has the same material composition as the dielectric material 632. The other dielectric material 634 may be located between the electrode structure 636 and the conductive material 622. For clarity, in FIG. 6D, the conductive liner material 624 (FIG. 6B) is not illustrated around the conductive material 622. However, it will be understood that in some embodiments, the memory cell 602'''' may include the conductive liner material 624.

Accordingly, each of the pillars 108 (FIG. 2) may provide a string of memory cells 602 extending either vertically through the stack structures 202 or at least somewhat vertically, in light of pillar bending.

Whether the memory cells 602, and therefore the microelectronic device structures (e.g., the microelectronic device structure 200 of FIG. 2), are formed with replacement gates (e.g., to form the memory cells 602' of FIG. 6A, the memory cells 602'' of FIG. 6B, the memory cell 602''' of FIG. 6C) or with floating gates (e.g., to form the memory cells 602'''' of FIG. 6D), the memory cells 602 may be located at an intersection of one of the other structures 604 (e.g., of one of the tiers 506 of the stack structure 202 of FIG. 2) and one of the pillars 108 extending vertically or at a somewhat bent direction through the stack structure 202 (FIG. 2), the pillars 108 including at least the channel material 612.

FIG. 7 through FIG. 12 illustrate various stages of processing to fabricate—by a "replacement gate" process—the structure of FIG. 5 such that the illustrations of FIG. 7 through FIG. 12 correspond to the area indicated by box 402 of FIG. 4. Moreover, as the area indicated by box 402 may represent one or more portions of previously-discussed structures, the illustrations of FIG. 7 through FIG. 12 likewise illustrate various stages of processing to fabricate the structures of FIG. 1 through FIG. 4 and FIG. 6A through FIG. 6C.

Figure 7:
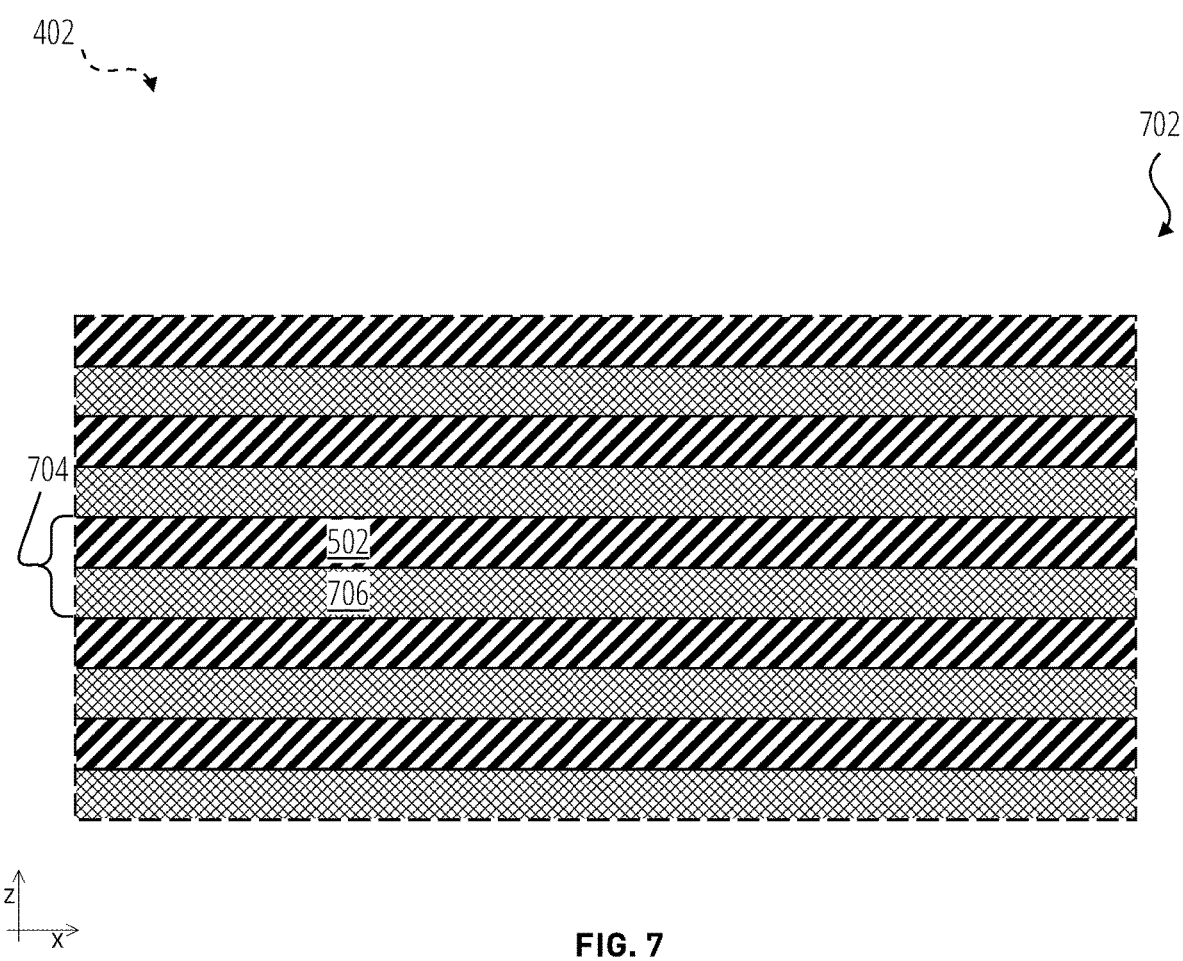
FIG. 7 through FIG. 12 are cross-sectional, elevational, schematic illustrations during various stages of processing to fabricate the structure of FIG. 5, and therefore the structure of microelectronic device structure of FIG. 2, in accordance with embodiments of the disclosure.

With reference to FIG. 7, a stack structure 702 may be formed, with tiers 704 of the insulative structures 502 and sacrificial structures 706, by sequentially and alternatingly forming (e.g., depositing) the insulative material(s) of the insulative structures 502 and sacrificial material(s) of the sacrificial structures 706. The sacrificial structures 706 are formed at the levels that will eventually be the conductive structures 504 (FIG. 5). The sacrificial structures 706 may be formed of and include a material formulated to be selectively removable without removing the insulative structures 502. For example, in some embodiments, in which the insulative structures 502 are formed of and include silicon oxide, the sacrificial structures 706 may be formed of and include, e.g., silicon nitride.

Figure 8:
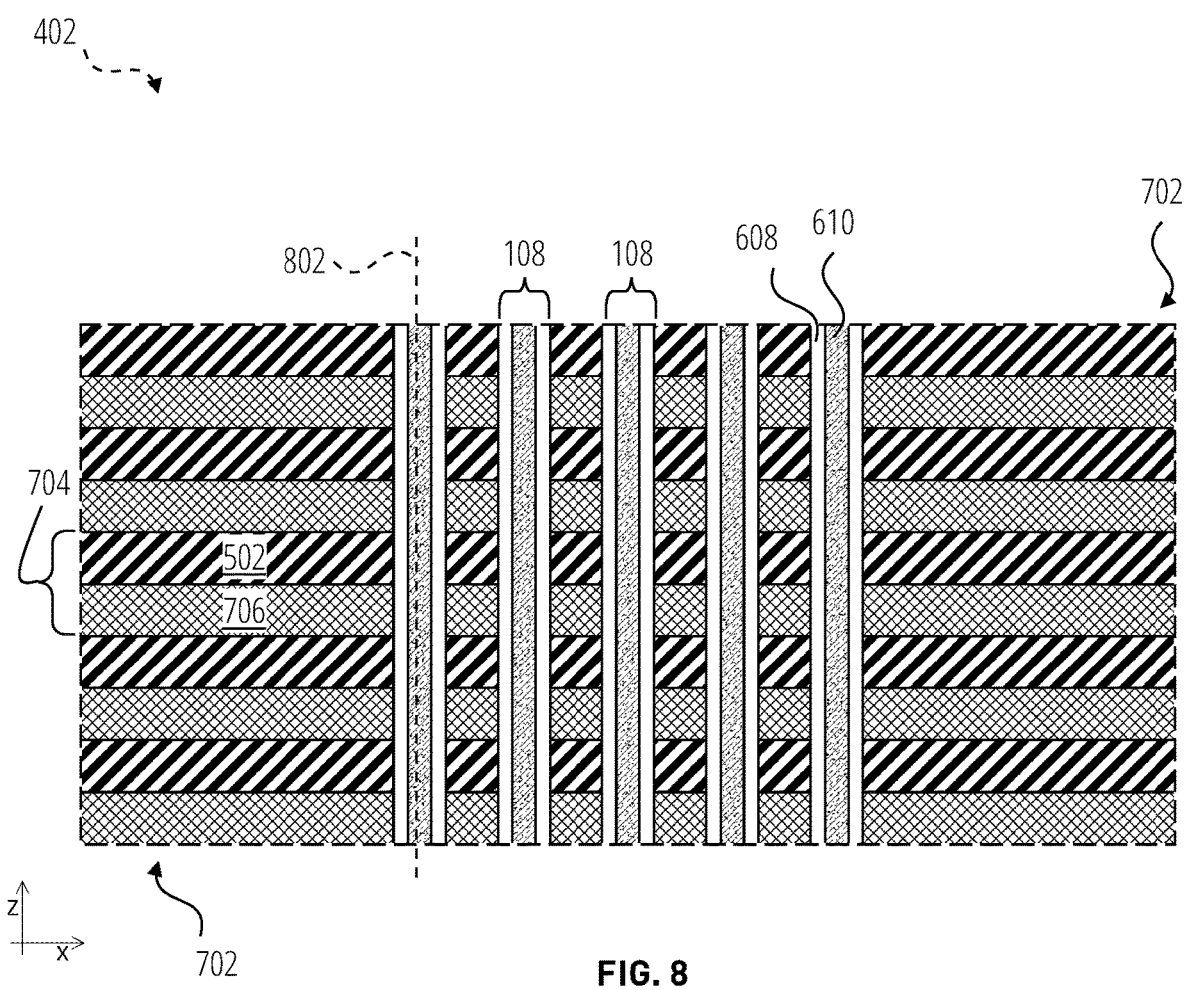

With reference to FIG. 8, the pillars 108 of a first deck, e.g., the lower deck 102 of the microelectronic device structure 200 of FIG. 2, may then be formed to extend through the stack structure 702. A reticle defining an arrangement of the pillars 108 (e.g., the arrangement of the pillars 108 illustrated in FIG. 1) may be used to pattern, e.g., a hardmask structure with the pillar arrangement, and then the hardmask structure may be used to transfer the pattern of the pillar arrangement through the stack structure 702 to define pillar openings in which the materials of the pillars 108 will be formed. In light of the progressed spacing of the slit structures 104 (FIG. 1) to be formed, the reticle may define progressive spacing for the arrays of pillars 108 that are to occupy the blocks 106 (FIG. 1), such as in the arrangement of pillars 108 of FIG. 1. Accordingly, the arrangement of pillars 108 of FIG. 1 may correspond to (e.g., illustratively represent) a pillar arrangement of a reticle to be used in forming the microelectronic device structure 200 of FIG. 2 (and, therefore, the structure of FIG. 8).

Once the pillar openings have been formed through the stack structure 702 of the first deck (e.g., the lower deck 102 of the microelectronic device structure 200 of FIG. 2), the materials of the pillars 108 may be formed in the openings, e.g., sequentially from outermost material to innermost material (e.g., from radially most outward to radially most inward), such that the cell material(s) 608 may be formed, sequentially, first, followed by forming the insulative material 610.

After the pillars 108 of the first deck (e.g., the lower deck 102 of the microelectronic device structure 200 of FIG. 2) have been formed, an additional stack structure 702 like that of FIG. 7 may be formed over the first deck, the same or a different reticle used to form additional pillar openings, and additional pillar materials formed in the pillar openings to form additional pillars 108 of a second deck overlying the first deck (e.g., the upper deck 206 of the microelectronic device structure 200 of FIG. 2). Accordingly, the stages of FIG. 7 and FIG. 8 may be repeated, as needed, to form the multiple decks (e.g., the lower deck 102 the upper deck 206) of the microelectronic device structure 200 (FIG. 2).

In some embodiments, when the pillars 108 are first formed through the stack structure 702 of their respective deck (e.g., the lower deck 102, the upper deck 206 of FIG. 2), the pillars 108 may be substantially vertical, as indicated by vertical line 802.

Figure 9:
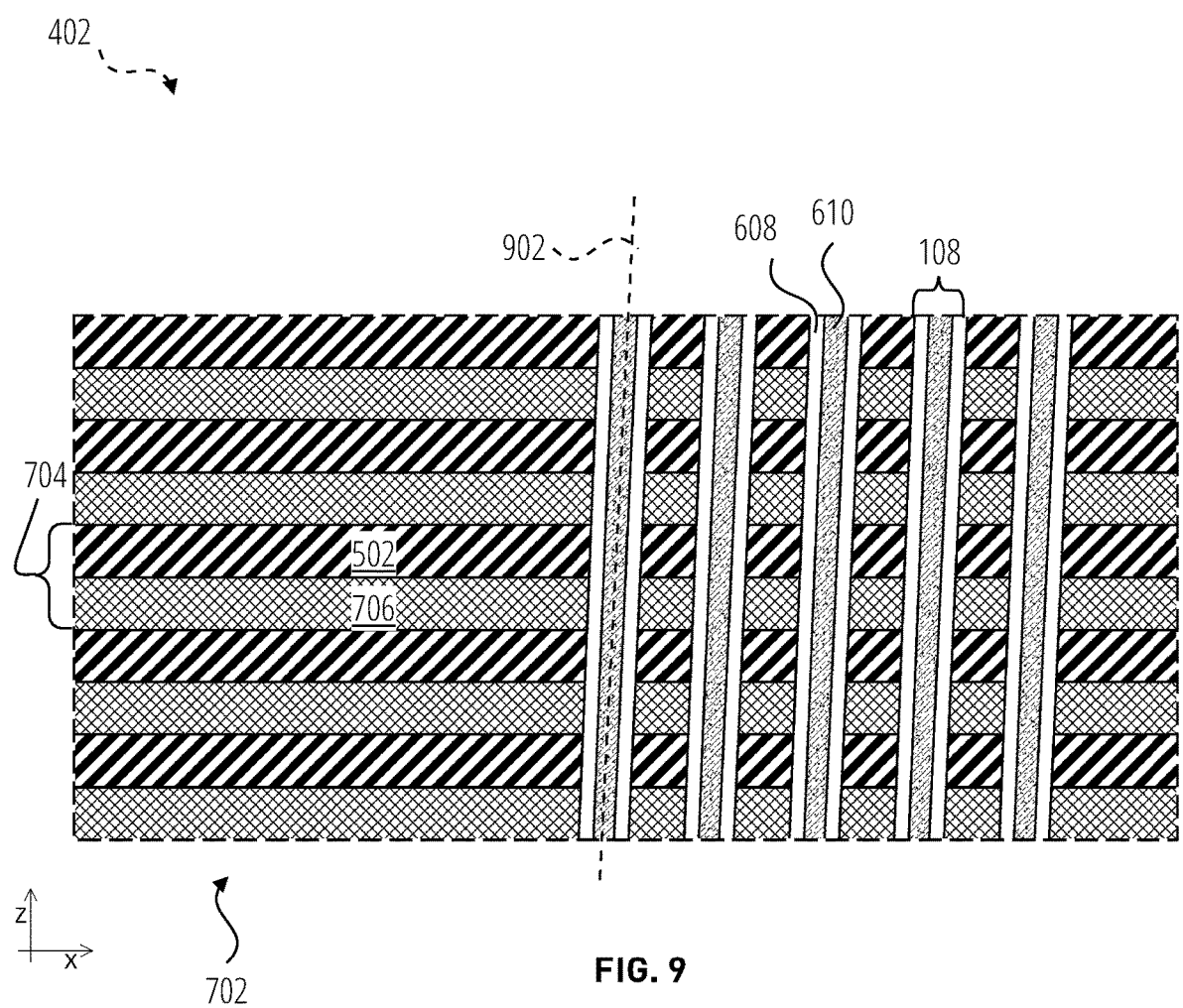

However, with reference to FIG. 9, due to, e.g., material stresses of neighboring materials or structures or the lack of material stresses from neighboring materials or structures (e.g., depending on the presence or absence of features in the adjacent portion 112 (FIG. 2)), the pillars 108 may bend away from the vertical, as indicated by non-vertical line 902. The amount of bending (e.g., the degree to which non-vertical line 902 deviates from a true vertical, such as vertical line 802 of FIG. 8) may, as discussed above, vary across the series of arrays of the pillars 108, depending on, e.g., lateral distance from the adjacent portion 112 (FIG. 2).

While FIG. 9 illustrates the pillar bending as a substantially-straight line (e.g., non-vertical line 902), the disclosure is not so limited. The profile of a bent pillar 108 may be other than straight, such as curved in one or more directions through any number of tiers 704 (e.g., any number of the tiers 506 of FIG. 5). For example, in some embodiments, near the base of the pillars 108, the pillars 108 may extend substantially vertically, such as consistent with vertical line 802 of FIG. 8; but, at upper elevations of the pillars 108, the pillars 108 may curvingly bend toward or away from the adjacent portion 112 (FIG. 2), with the greatest deviation from true-vertical being exhibited proximate the upper surface of the deck through which the pillars 108 extend.

Figure 10:
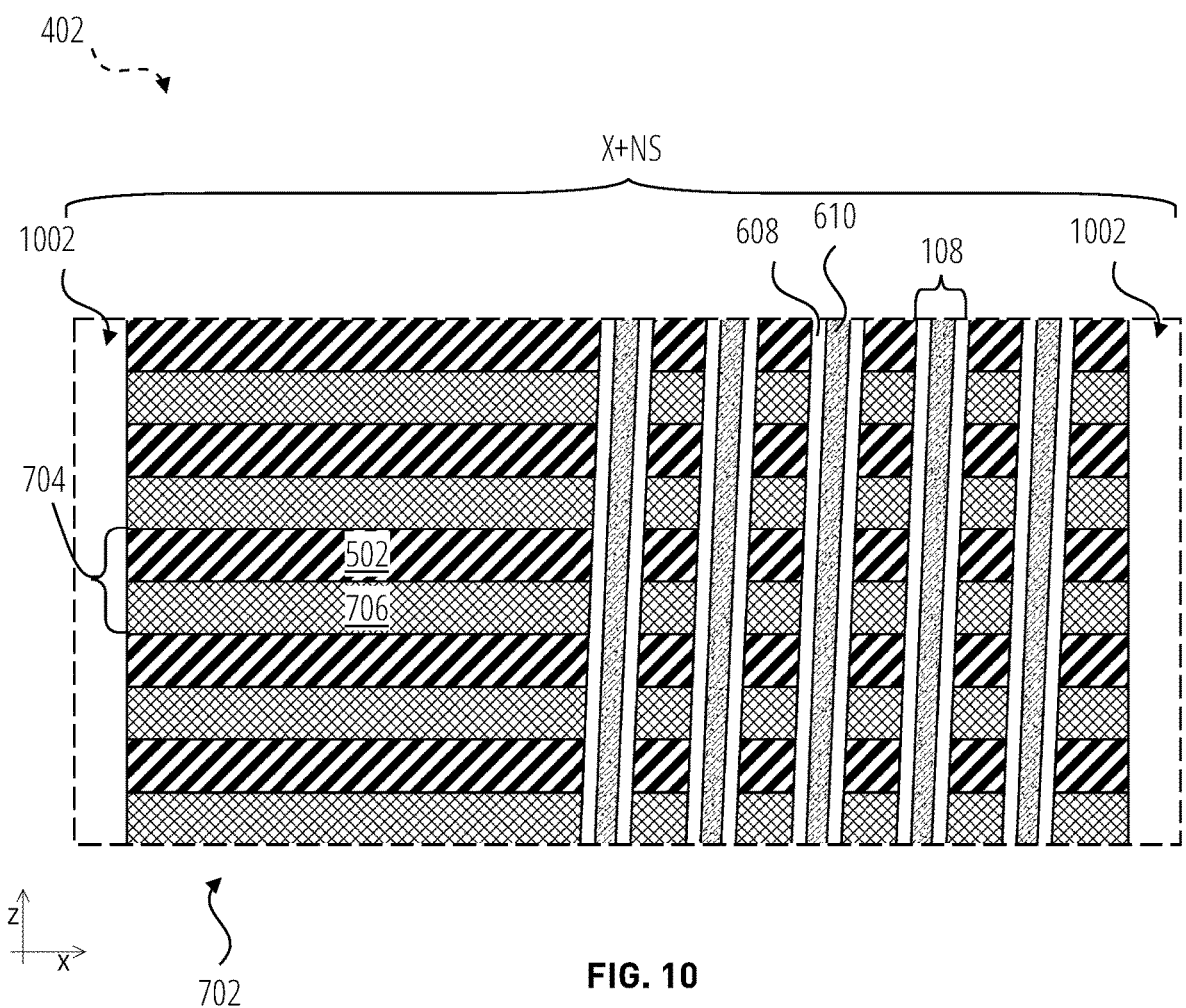

With reference to FIG. 10, slit openings 1002 may then be formed (e.g., etched) through the stack structures 702. The slit openings 1002 may be formed to extend through all stack structures 202 of the fabricated decks (e.g., through both the upper deck 206 and the lower deck 102 of FIG. 2). An additional reticle may be used to form the slit openings 1002, with the additional reticle defining an arrangement of the slit openings 1002 that is in accordance with the above-described progressed spacing of the slit structures 104. For example, the additional reticle may define progressively spaced slit openings 1002 (e.g., spaced at widths X+NS) corresponding to the progressive spacing of the slit structures 104 of FIG. 1. Therefore, the illustrated slit structures 104 of FIG. 1 may likewise illustrate a progressively spaced slit openings 1002 arrangement of the additional reticle.

Because the slit openings 1002 are formed at the progressive spacing of the slit structures 104, forming (e.g., etching) the slit openings 1002 ensures that the pillars 108 are not etched and that at least some portion of the materials of the stack structure 702 (e.g., at least some portion of the sacrificial structures 706) remain interposed between the pillars 108 and the adjacent slit openings 1002.

Figure 11:
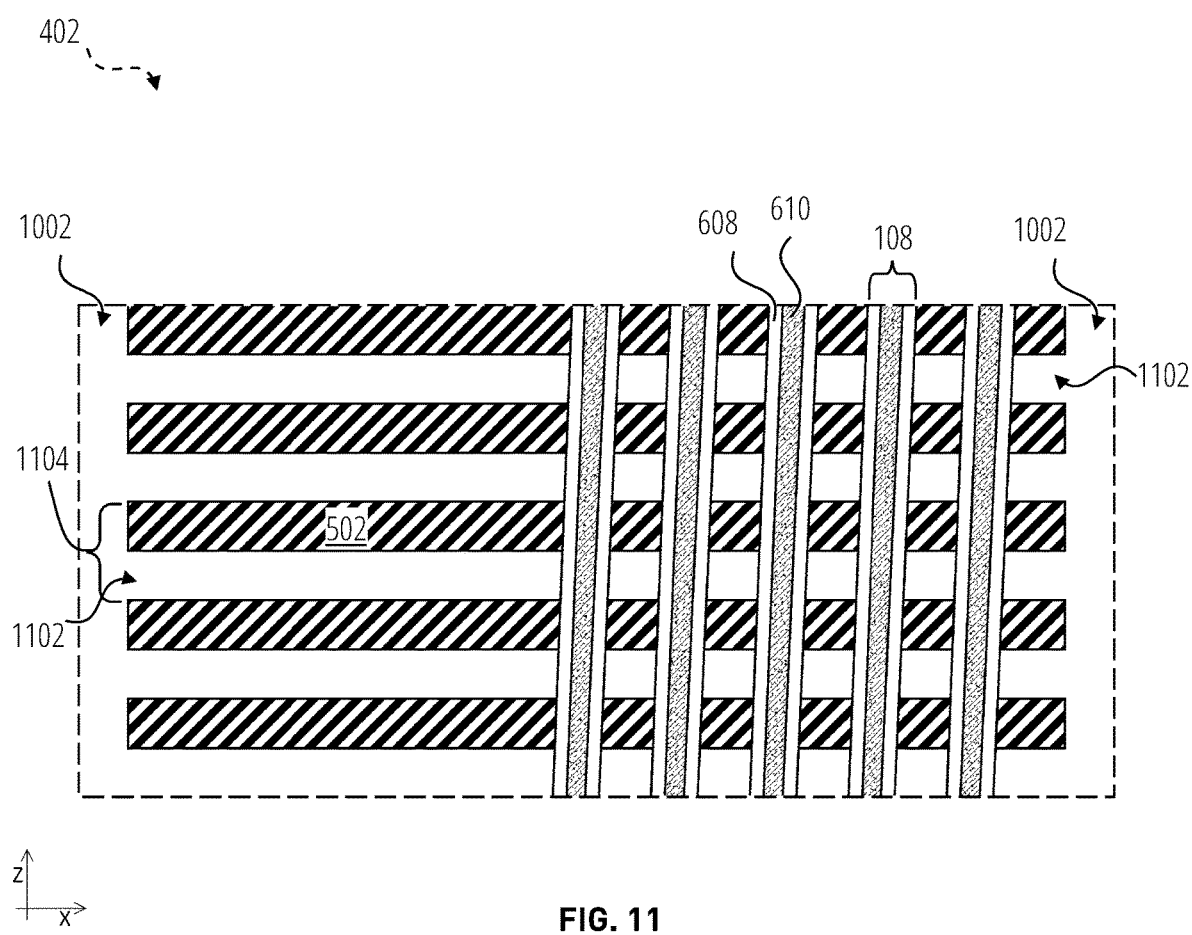

After forming the slit openings 1002, at the progressive spacing for the slit structures 104 (FIG. 2), the sacrificial structures 706 may be substantially removed, as illustrated in FIG. 11, leaving voids 1102 between the insulative structures 502, such that tiers 1104 include the insulative structures 502 alternating with the voids 1102.

The materials of the other structures 604 (FIG. 6A through FIG. 6C) may then be formed (e.g., deposited, grown) in the voids 1102 in order, such as by first forming those materials that are directly adjacent the cell material(s) 608 and/or the insulative structures 502 and then forming those materials that are next adjacent. For example, to form the memory cell 602' of FIG. 6A, the conductive material(s) 606 of FIG. 6A may be formed directly on the sidewall surfaces of the pillars 108 (e.g., of the cell material(s) 608), and on the upper and lower surfaces of the insulative structures 502, exposed by the voids. As another example, to form the memory cell 602" of FIG. 6B, the conductive liner material 624 (FIG. 6B) may be formed directly on the sidewall surfaces of the pillars 108 (e.g., of the cell material(s) 608), and on the upper and lower surfaces of the insulative structures 502, exposed by the voids 1102; and then, the conductive material 622 may be formed (e.g., deposited, grown) directly on the conductive liner material 624. As still another example, to form the memory cell 602''' of FIG. 6C, the first dielectric material 626 may be formed directly on the sidewall surfaces of the pillars 108; then the second dielectric material 628, the third dielectric material 630, the conductive liner material 624 (if included), and the conductive material 622 may be sequentially formed on the first dielectric material 626 and on the upper and lower surfaces of the insulative structures 502 exposed by the voids 1102. Accordingly, the conductive structures 504 (FIG. 5) are formed in the levels previously occupied by the sacrificial structures 706 (FIG. 7).

Figure 12:
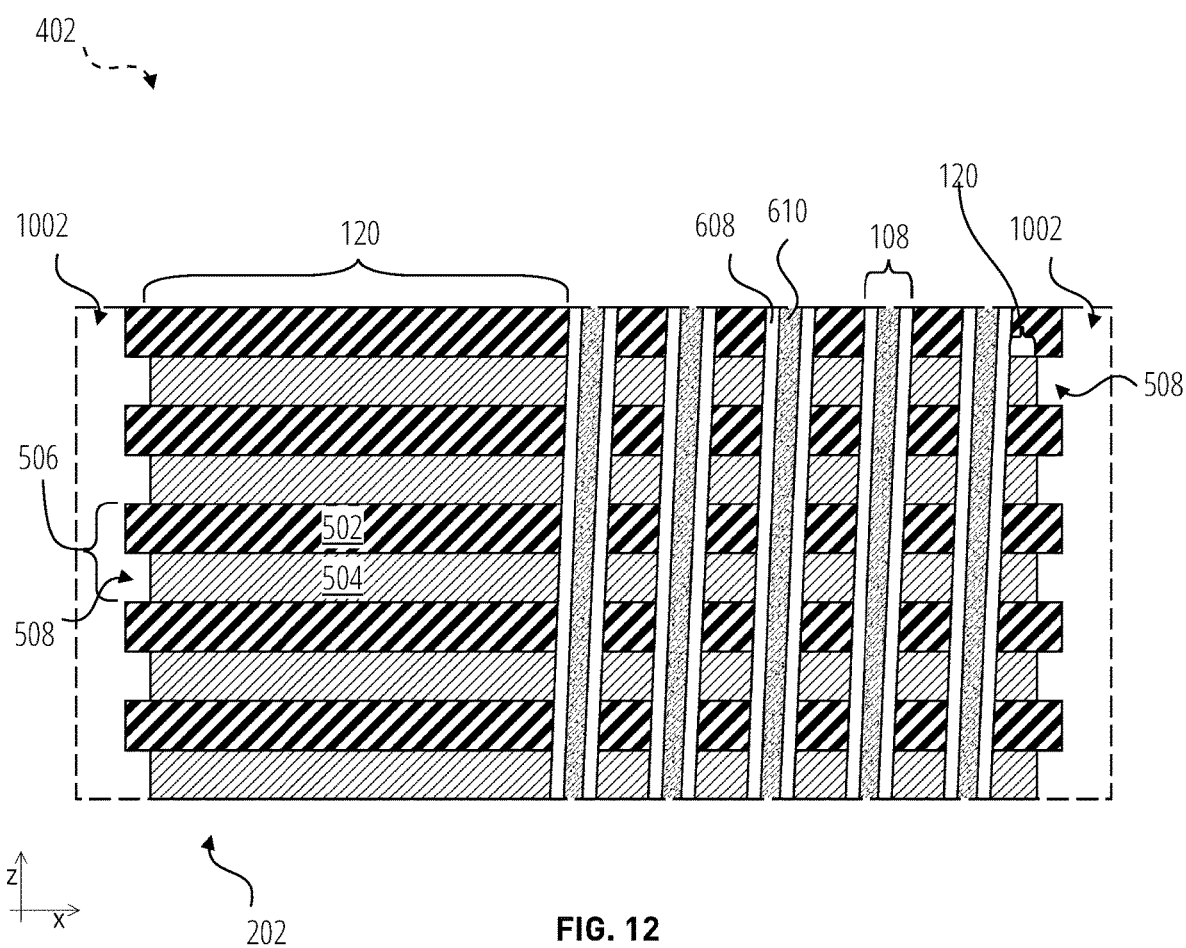

With reference to FIG. 12, the conductive structures 504 may be formed (e.g., as described above), to leave the recesses 508 adjacent the slit openings 1002. In other embodiments, the conductive structures 504 may be formed to first overfill the voids 1102 of FIG. 11 and then the material of the conductive structures 504 partially removed to form the recesses 508. In still other embodiments, the conductive structures 504 may be formed to not be recessed relative to the sidewalls of the insulative structures 502.

The material of the slit structures 104 may then be formed in the slit openings 1002 to form the structure of FIG. 5. The structures of the adjacent portion 112 may have been formed prior to the stage of FIG. 7, at some stage between the stage of FIG. 7 through FIG. 12 and FIG. 5, or subsequent to forming the structure of FIG. 5.

Accordingly, disclosed is a method of forming a microelectronic device. The method comprises forming a stack structure comprising a vertically alternating sequence of insulative structures and other structures arranged in tiers. A series of arrays of pillars is formed through the stack structure. At least some of the pillars exhibit bending. A series of slit openings is formed through the stack structure to divide the stack structure into a series of blocks. The blocks of a progressed portion of the series of blocks each comprise an array of the series of arrays of pillars. Each of the blocks, of the progressed portion, also comprises a different block width than a block width of at least one neighboring block of the progressed portion of the series of blocks.

While the figures illustrate, and the embodiments described above discuss, progressive arrangement of features (e.g., the progressed spacing of arrays of the pillars 108, the progressed spacing of the slit openings 1002 (FIG. 10), the progressed spacing of the slit structures 104 (FIG. 2), the progressed widths of the blocks 106 (FIG. 2)) along an X-axis direction, reticle patterns—and therefore progressive arrangements of features—may also or alternatively be tailored along a different horizontal direction, such as along a Y-axis direction, or both, to achieve the same results described above.

Accordingly, disclosed is a microelectronic device comprising at least two decks each comprising a stack structure. The stack structure includes vertically interleaved insulative structures and conductive structures. The stack structure comprises at least one portion, which comprises arrays of pillars and a series of slit structures. The arrays of pillars extend through the stack structure. The series of slit structures vertically extends through the stack structure and divides the arrays of pillars and the stack structure, of the at least one portion, into a series of blocks. Each block of the series of blocks comprises one of the arrays of pillars. The series of blocks comprises at least one progressed portion adjacent an additional portion of the stack structure. Within each of the at least one progressed portion of the series of blocks, the blocks have different widths than one another.

Figure 13:
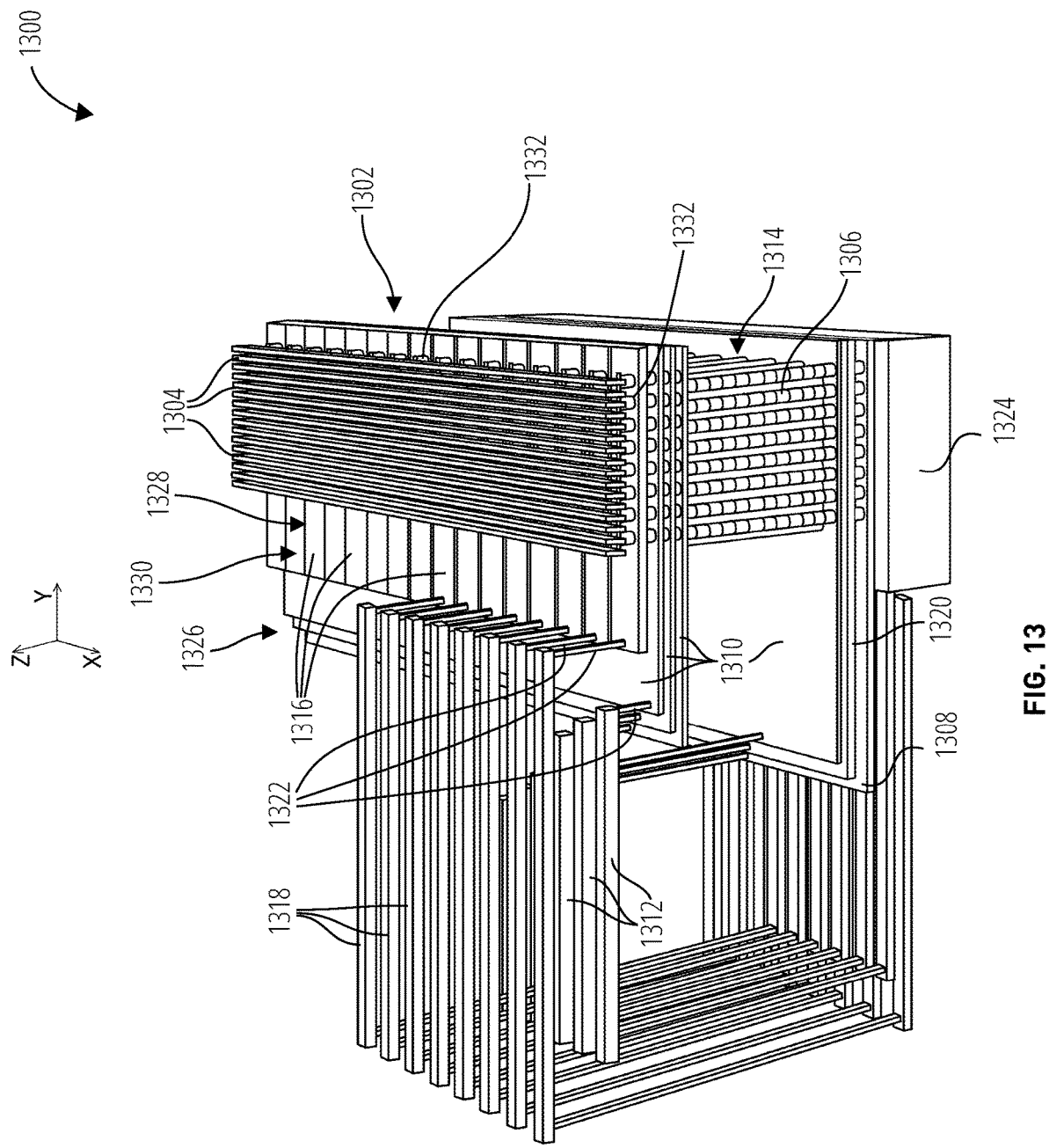
FIG. 13 is a partial, cutaway, perspective, schematic illustration of a microelectronic device, in accordance with embodiments of the disclosure.

With reference to FIG. 13, illustrated is a partial cutaway, perspective, schematic illustration of a portion of a microelectronic device 1300 (e.g., a memory device, such as a dual deck 3D NAND Flash memory device) including a microelectronic device structure 1302. The microelectronic device structure 1302 may be substantially similar to, e.g., the microelectronic device structure 200 of FIG. 2.

As illustrated in FIG. 13, the microelectronic device structure 1302 may include a staircase structure 1326 defining contact regions for connecting access lines 1312 to conductive tiers 1310 (e.g., conductive layers, conductive plates, such as the conductive structures 504 (FIG. 5) of the stack structures 202 of FIG. 2). The microelectronic device structure 1302 may include pillars 108 (FIG. 2) with strings 1314 (e.g., strings of memory cells 1306 (e.g., one or more of the memory cells 602 of FIG. 6A through FIG. 6D)) that are coupled to each other in series. The pillars 108 with the strings 1314 may extend at least somewhat vertically (e.g., in the Z-direction) and orthogonally relative to conductive tiers 1310, relative to data lines 1304, relative to a source tier 1308 (e.g., within the base structure(s) 204 (FIG. 2)), relative to access lines 1312, relative to first select gates 1316 (e.g., upper select gates, drain select gates (SGDs)), relative to select lines 1318, and/or relative to a second select gate 1320 (e.g., a lower select gate, a source select gate (SGS)). However, one or more of the pillars 108 (FIG. 2) with the strings 1314 may exhibit bending in upper elevations. The first select gates 1316 may be horizontally divided (e.g., in the X-direction) into multiple blocks 1330 (e.g., blocks 106 (FIG. 2)) with progressive spacing (e.g., in the X-direction) from one another by slits 1328 (e.g., slit structures 104 (FIG. 2)).

Vertical conductive contacts 1322 may electrically couple components to each other, as illustrated. For example, the select lines 1318 may be electrically coupled to the first select gates 1316, and the access lines 1312 may be electrically coupled to the conductive tiers 1310. The microelectronic device 1300 may also include a control unit 1324 positioned under the memory array, which may include at least one of string driver circuitry, pass gates, circuitry for selecting gates, circuitry for selecting conductive lines (e.g., the data lines 1304, the access lines 1312), circuitry for amplifying signals, and circuitry for sensing signals. The control unit 1324 may be electrically coupled to the data lines 1304, the source tier 1308, the access lines 1312, the first select gates 1316, and/or the second select gates 1320, for example. In some embodiments, the control unit 1324 includes CMOS (complementary metal-oxide-semiconductor) circuitry. In such embodiments, the control unit 1324 may be characterized as having a "CMOS under Array" ("CuA") configuration.

The first select gates 1316 may extend horizontally in a first direction (e.g., the Y-direction) and may be coupled to respective first groups of strings 1314 of memory cells 1306 at a first end (e.g., an upper end) of the strings 1314. The second select gate 1320 may be formed in a substantially planar configuration and may be coupled to the strings 1314 at a second, opposite end (e.g., a lower end) of the strings 1314 of memory cells 1306.

The data lines 1304 (e.g., bit lines) may extend horizontally in a second direction (e.g., in the X-direction) that is at an angle (e.g., perpendicular) to the first direction in which the first select gates 1316 extend. The data lines 1304 may be coupled to respective second groups of the strings 1314 at the first end (e.g., the upper end) of the strings 1314. A first group of strings 1314 coupled to a respective first select gate 1316 may share a particular string 1314 with a second group of strings 1314 coupled to a respective data line 1304. Thus, a particular string 1314 may be selected at an intersection of a particular first select gate 1316 and a particular data line 1304. Accordingly, the first select gates 1316 may be used for selecting memory cells 1306 of the strings 1314 of memory cells 1306.

The conductive tiers 1310 (e.g., word line plates) may extend in respective horizontal planes. The conductive tiers 1310 may be stacked vertically, such that each conductive tier 1310 is coupled to all of the strings 1314 of memory cells 1306, and the strings 1314 of the memory cells 1306 extend vertically—with one or more of the strings 1314 possibly exhibiting some pillar bending—through the stack (e.g., stack structure 202 (FIG. 2)) of conductive tiers 1310. The conductive tiers 1310 may be coupled to or may form control gates of the memory cells 1306 to which the conductive tiers 1310 are coupled. Each conductive tier 1310 may be coupled to one memory cell 1306 of a particular string 1314 of memory cells 1306.

The first select gates 1316 and the second select gates 1320 may operate to select a particular string 1314 of the memory cells 1306 between a particular data line 1304 and the source tier 1308. Thus, a particular memory cell 1306 may be selected and electrically coupled to a data line 1304 by operation of (e.g., by selecting) the appropriate first select gate 1316, second select gate 1320, and conductive tier 1310 that are coupled to the particular memory cell 1306.

The staircase structure 1326 may be configured to provide electrical connection between the access lines 1312 and the conductive tiers 1310 through the vertical conductive contacts 1322. In other words, a particular level of the conductive tiers 1310 may be selected via one of the access lines 1312 that is in electrical communication with a respective one of the conductive contacts 1322 in electrical communication with the particular conductive tier 1310.

The data lines 1304 may be electrically coupled to the strings 1314 through conductive structures 1332.

Figure 14:
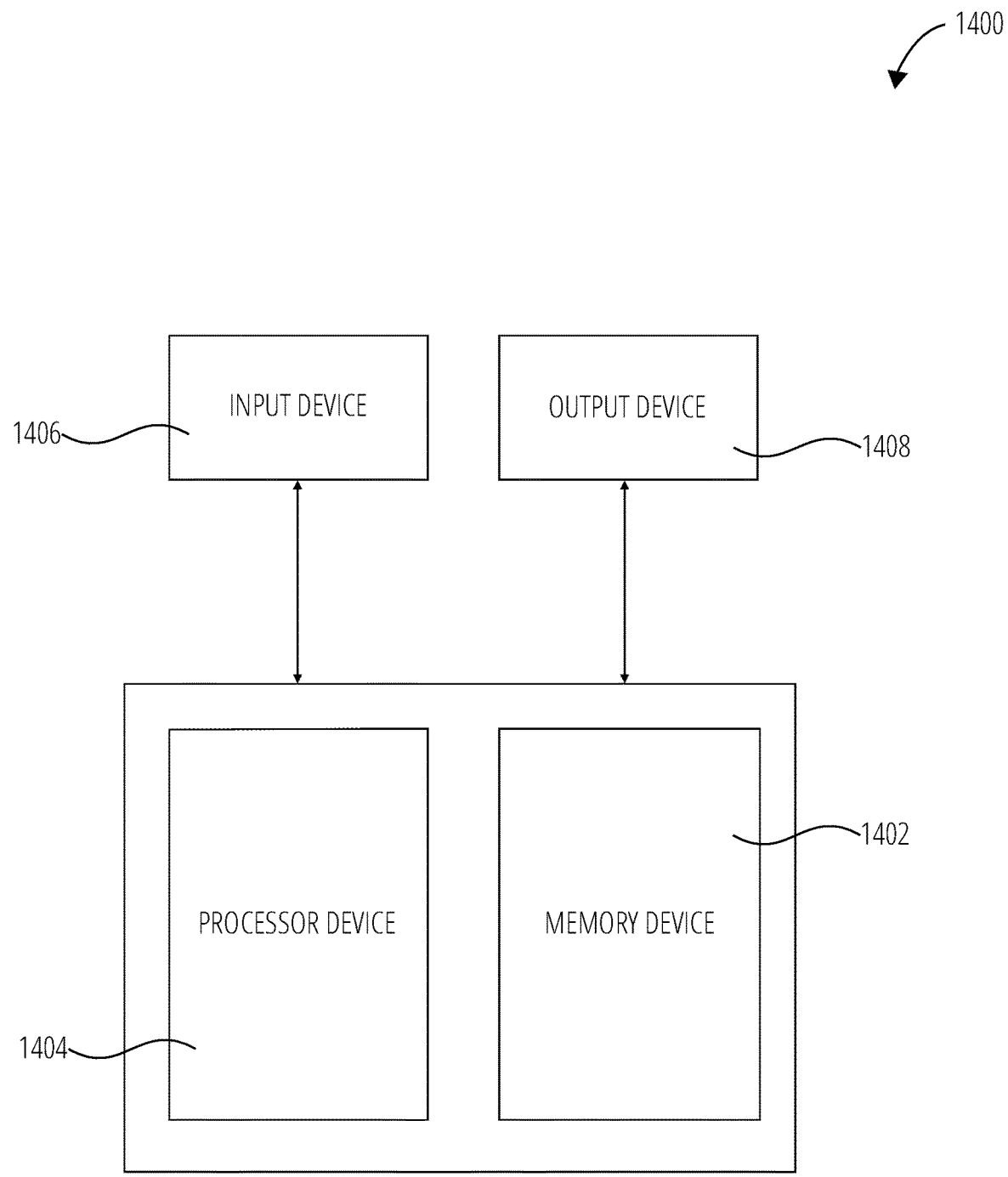
FIG. 14 is a block diagram of an electronic system, in accordance with embodiments of the disclosure.

Microelectronic devices (e.g., the microelectronic device 1300) including microelectronic device structures (e.g., the microelectronic device structure 200 of FIG. 2) may be used in embodiments of electronic systems of the disclosure. For example, FIG. 14 is a block diagram of an electronic system 1400, in accordance with embodiments of the disclosure. The electronic system 1400 may comprise, for example, a computer or computer hardware component, a server or other networking hardware component, a cellular telephone, a digital camera, a personal digital assistant (PDA), a portable media (e.g., music) player, a Wi-Fi or cellular-enabled tablet (e.g., an iPAD® or SURFACE® tablet, an electronic book, a navigation device), etc. The electronic system 1400 includes at least one memory device 1402. The memory device 1402 may include, for example, one or more embodiment of a microelectronic device and/or structure previously described herein (e.g., the microelectronic device 1300 of FIG. 13, the microelectronic device structure 200 of FIG. 2), e.g., with structures formed according to embodiments previously described herein.

The electronic system 1400 may further include at least one electronic signal processor device 1404 (often referred to as a "microprocessor"). The processor device 1404 may, optionally, include an embodiment of a microelectronic device and/or a microelectronic device structure previously described herein (e.g., the microelectronic device 1300 of FIG. 13, the microelectronic device structure 200 of FIG. 2). The electronic system 1400 may further include one or more input devices 1406 for inputting information into the electronic system 1400 by a user, such as, for example, a mouse or other pointing device, a keyboard, a touchpad, a button, or a control panel. The electronic system 1400 may further include one or more output devices 1408 for outputting information (e.g., visual or audio output) to a user such as, for example, a monitor, a display, a printer, an audio output jack, a speaker, etc. In some embodiments, the input device 1406 and the output device 1408 may comprise a single touchscreen device that can be used both to input information into the electronic system 1400 and to output visual information to a user. The input device 1406 and the output device 1408 may communicate electrically with one or more of the memory device 1402 and the electronic signal processor device 1404.

Accordingly, disclosed is an electronic system comprising an input device, an output device, a processor device, and a memory device. The processor device is operably coupled to the input device and to the output device. The memory device is operably coupled to the processor and comprises at least one microelectronic device structure. The at least one microelectronic device structure comprises a series of progressively spaced slit structures extending through a stack structure. The series of progressively spaced slit structures defines a series of blocks of pillars comprising at least some pillars exhibiting bending.

Figure 15:
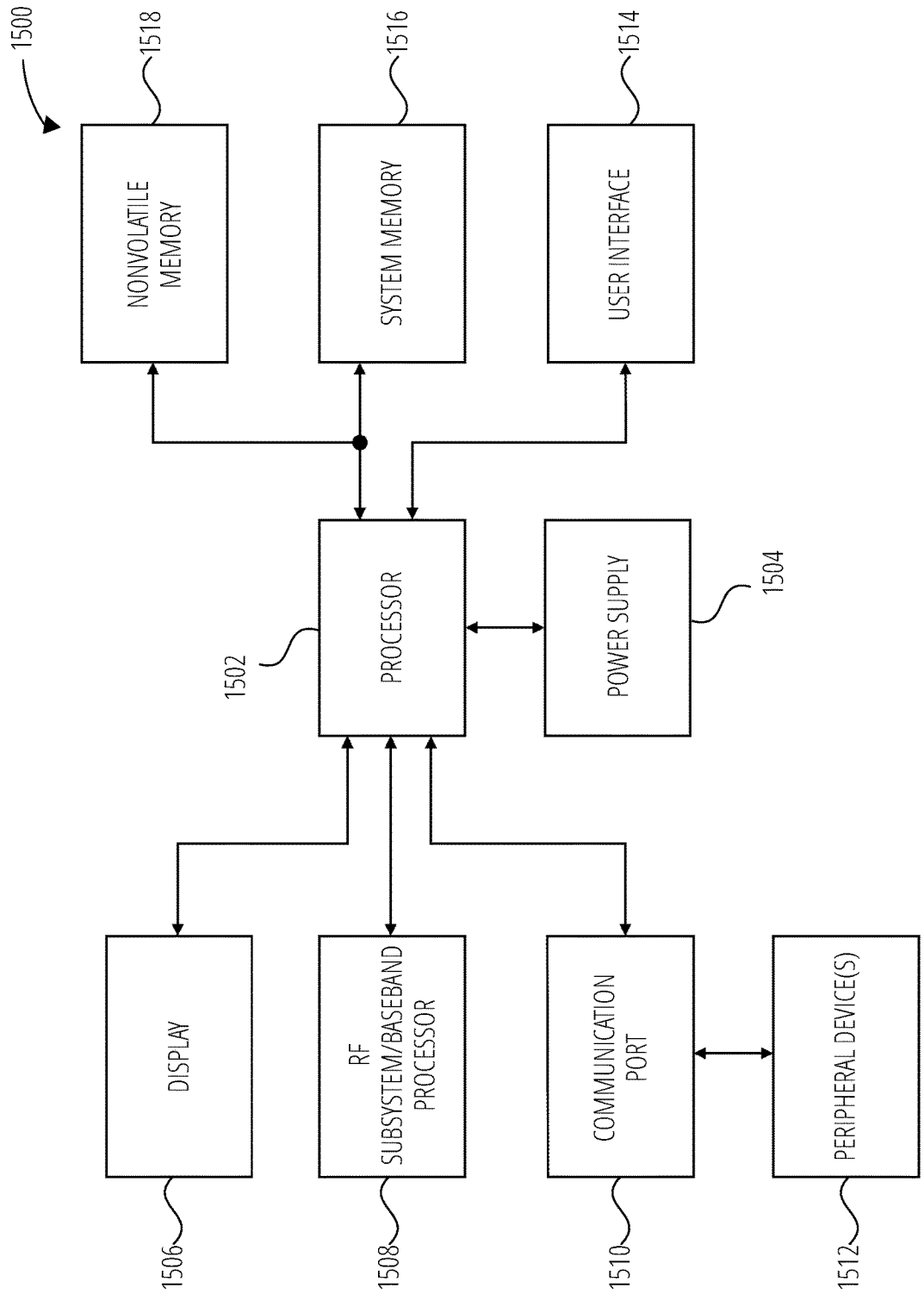
FIG. 15 is a block diagram of a processor-based system, in accordance with embodiments of the disclosure.

With reference to FIG. 15, shown is a block diagram of a processor-based system 1500. The processor-based system 1500 may include various microelectronic devices (e.g., the microelectronic device 1300 of FIG. 13) and microelectronic device structures (e.g., the microelectronic device structure 200 of FIG. 2) manufactured in accordance with embodiments of the present disclosure. The processor-based system 1500 may be any of a variety of types, such as a computer, a pager, a cellular phone, a personal organizer, a control circuit, or another electronic device. The processor-based system 1500 may include one or more processors 1502, such as a microprocessor, to control the processing of system functions and requests in the processor-based system 1500. The processor 1502 and other subcomponents of the processor-based system 1500 may include microelectronic devices (e.g., the microelectronic device 1300 of FIG. 13) and microelectronic device structures (e.g., the microelectronic device structure 200 of FIG. 2) manufactured in accordance with embodiments of the present disclosure.

The processor-based system 1500 may include a power supply 1504 in operable communication with the processor 1502. For example, if the processor-based system 1500 is a portable system, the power supply 1504 may include one or more of a fuel cell, a power scavenging device, permanent batteries, replaceable batteries, and/or rechargeable batteries. The power supply 1504 may also include an AC adapter; therefore, the processor-based system 1500 may be plugged into a wall outlet, for example. The power supply 1504 may also include a DC adapter such that the processor-based system 1500 may be plugged into a vehicle cigarette lighter or a vehicle power port, for example.

Various other devices may be coupled to the processor 1502 depending on the functions that the processor-based system 1500 performs. For example, a user interface 1514 may be coupled to the processor 1502. The user interface 1514 may include one or more input devices, such as buttons, switches, a keyboard, a light pen, a mouse, a digitizer and stylus, a touch screen, a voice recognition system, a microphone, or a combination thereof. A display 1506 may also be coupled to the processor 1502. The display 1506 may include an LCD display, an SED display, a CRT display, a DLP display, a plasma display, an OLED display, an LED display, a three-dimensional projection, an audio display, or a combination thereof. Furthermore, an RF subsystem/baseband processor 1508 may also be coupled to the processor 1502. The RF subsystem/baseband processor 1508 may include an antenna that is coupled to an RF receiver and to an RF transmitter. A communication port 1510, or more than one communication port 1510, may also be coupled to the processor 1502. The communication port 1510 may be adapted to be coupled to one or more peripheral devices 1512 (e.g., a modem, a printer, a computer, a scanner, a camera) and/or to a network (e.g., a local area network (LAN), a remote area network, an intranet, or the Internet).

The processor 1502 may control the processor-based system 1500 by implementing software programs stored in the memory (e.g., system memory 1516). The software programs may include an operating system, database software, drafting software, word processing software, media editing software, and/or media-playing software, for example. The memory (e.g., the system memory 1516) is operably coupled to the processor 1502 to store and facilitate execution of various programs. For example, the processor 1502 may be coupled to system memory 1516, which may include one or more of spin torque transfer magnetic random access memory (STT-MRAM), magnetic random access memory (MRAM), dynamic random access memory (DRAM), static random access memory (SRAM), racetrack memory, and/or other known memory types. The system memory 1516 may include volatile memory, nonvolatile memory, or a combination thereof. The system memory 1516 is typically large so it can store dynamically loaded applications and data. In some embodiments, the system memory 1516 may include semiconductor devices (e.g., the microelectronic device 1300 of FIG. 13) and structures (e.g., the microelectronic device structure 200 of FIG. 2) described above, or a combination thereof.

The processor 1502 may also be coupled to nonvolatile memory 1518, which is not to suggest that system memory 1516 is necessarily volatile. The nonvolatile memory 1518 may include one or more of STT-MRAM, MRAM, read-only memory (ROM) (e.g., EPROM, resistive read-only memory (RROM)), and Flash memory to be used in conjunction with the system memory 1516. The size of the nonvolatile memory 1518 is typically selected to be just large enough to store any necessary operating system, application programs, and fixed data. Additionally, the nonvolatile memory 1518 may include a high-capacity memory (e.g., disk drive memory, such as a hybrid-drive including resistive memory or other types of nonvolatile solid-state memory, for example). The nonvolatile memory 1518 may include microelectronic devices (e.g., the microelectronic device 1300 of FIG. 13) and structures (e.g., the microelectronic device structure 200 of FIG. 2) described above, or a combination thereof.

While the disclosed structures, apparatus (e.g., devices), systems, and methods are susceptible to various modifications and alternative forms in implementation thereof, specific embodiments have been shown by way of example in the drawings and have been described in detail herein. However, the disclosure is not intended to be limited to the particular forms disclosed. Rather, the disclosure encompasses all modifications, combinations, equivalents, variations, and alternatives falling within the scope of the disclosure as defined by the following appended claims and their legal equivalents.

What is claimed is:

1. A microelectronic device, comprising:
   a stack structure comprising a vertically alternating sequence of insulative structures and conductive structures arranged in tiers; and
   a series of slit structures extending through the stack structure and dividing the stack structure into a series of blocks,
   in a progressed portion of the series of blocks, each block comprising:
      an array of pillars extending through the stack structure of the block; and
      a different block width than a block width of a neighboring block of the progressed portion of the series of blocks,
      wherein, for each block of the progressed portion of the series of blocks neighboring two blocks in the progressed portion of the series of blocks the different block width is equally greater in block width from a first of the two neighboring blocks as it is lesser in block width from a second of the two neighboring blocks,
      at least one pillar, of the array of pillars in the progressed portion, exhibiting bending.

2. The microelectronic device of claim 1, wherein the series of blocks further comprises a non-progressed portion of the series of blocks, each block of the non-progressed portion comprising:
   an additional array of pillars extending through the stack structure of the block of the non-progressed portion; and
   a substantially equal block width as a block width of a neighboring block of the non-progressed portion.

3. The microelectronic device of claim 1, wherein the series of blocks further comprises an additional progressed portion of the series of blocks, each block of the additional progressed portion comprising:
   an additional array of pillars extending through the stack structure; and
   a different block width than a block width of neighboring blocks of the additional progressed portion of the series of blocks.

4. The microelectronic device of claim 3, wherein the progressed portion and the additional progressed portion of the series of blocks are on opposing lateral sides of an adjacent portion of the stack structure.

5. The microelectronic device of claim 4, wherein the adjacent portion of the stack structure comprises at least one conductive contact extending through at least a portion of the stack structure.

6. The microelectronic device of claim 3, wherein:
   in the progressed portion of the series of blocks, the block widths decrease with increased lateral distance from the additional progressed portion; and
   in the additional progressed portion of the series of blocks, the block widths decrease with increased lateral distance from the progressed portion.

7. The microelectronic device of claim 1, wherein the progressed portion of the series of blocks comprises more than ten of the blocks.

8. The microelectronic device of claim 1, wherein the conductive structures of at least one of the blocks, of the progressed portion of the series of blocks, comprise, in at least an upper elevation of the at least one of the blocks:
   a first rail portion between a first one of the slit structures and a first lateral side of the array of pillars; and
   a second rail portion between a second one of the slit structures and a second lateral side of the array of pillars, the second lateral side being opposite the first lateral side,
   the first rail portion differing in lateral width from the second rail portion.

9. The microelectronic device of claim 1, further comprising an additional portion of the stack structure adjacent the progressed portion of the series of blocks, the additional portion including an edge of the stack structure.

10. A method of forming a microelectronic device, comprising:
    forming a stack structure comprising a vertically alternating sequence of insulative structures and conductive structures arranged in tiers;
    forming a series of arrays of pillars extending through the stack structure, at least some of the pillars exhibiting bending; and
    forming a series of slit openings through the stack structure to divide the stack structure into a series of blocks, the blocks of a progressed portion of the series of blocks each comprising:
       an array of pillars of the series of arrays of pillars,
       a different block width than a block width of at least one neighboring block of the progressed portion of the series of blocks,
       wherein for each block of the progressed portion of the series of blocks neighboring two blocks in the progressed portion of the series of blocks the different block width is equally greater in block width from a first of the two neighboring blocks as it is lesser in block width from a second of the two neighboring blocks.

11. The method of claim 10, wherein forming the series of slit openings comprises forming the slit openings, of the progressed portion of the series of blocks, with a distance between a lateral center of one of the slit openings to a lateral center of a neighboring one of the slit openings increasing by a consistent width-increase value across the progressed portion of the series of blocks.

12. The method of claim 10, wherein forming the stack structure comprising the vertically alternating sequence of the insulative structures and the conductive structures arranged in the tiers comprises forming a precursor stack structure comprising the vertically alternating sequence of the insulative structures and other structures arranged in the tiers the other structures comprising at least one sacrificial material.

13. The method of claim 12, wherein forming the stack structure comprising the vertically alternating sequence of the insulative structures and the conductive structures arranged in the tiers further comprises replacing at least a portion of the other structures with at least one conductive material to form the conductive structures.

14. The method of claim 13, wherein replacing at least the portion of the other structures with the at least one conductive material to form the conductive structures follows forming the series of slit openings.

15. A microelectronic device, comprising:
    at least two decks each comprising a stack structure of vertically interleaved insulative structures and conductive structures, the stack structure comprising at least one portion comprising:
       arrays of pillars extending through the stack structure; and
       a series of slit structures vertically extending through the stack structure and dividing the arrays of pillars and the stack structure of the at least one portion into a series of blocks, each block of the series of blocks comprising one of the arrays of pillars, the series of blocks comprising at least one progressed portion adjacent an additional portion of the stack structure, within each of the at least one progressed portion of the series of blocks, the blocks having different widths than one another, and wherein, in the at least one progressed portion of the series of blocks, for each block neighboring two blocks in the at least one progressed portion, the different block width is equally greater in block width from a first of the two neighboring blocks as it is lesser in block width from a second of the two neighboring blocks.

16. The microelectronic device of claim 15, wherein, within the at least one progressed portion of the series of blocks, the widths of the blocks increase with decreased lateral distance from the additional portion of the stack structure.

17. The microelectronic device of claim 15, wherein the pillars, of at least one of the arrays of pillars in at least one of the blocks of the at least one progressed portion of the series of blocks, bend away from a vertical orientation.

18. The microelectronic device of claim 17, wherein the pillars bend away from the vertical orientation and toward the additional portion of the stack structure.

19. The microelectronic device of claim 17, wherein the pillars bend away from the vertical orientation and away from the additional portion of the stack structure.

20. The microelectronic device of claim 15, wherein the series of blocks of the at least one progressed portion comprises:
a widest block nearest the additional portion of the stack structure; and
a narrowest block furthest the additional portion of the stack structure.

21. The microelectronic device of claim 20, wherein the pillars of the widest block exhibit a greater amount of bending than the pillars of the narrowest block.

22. An electronic system, comprising:
an input device;
an output device;
a processor device operably coupled to the input device and to the output device; and
a memory device operably coupled to the processor device and comprising at least one microelectronic device structure, the at least one microelectronic device structure comprising a series of progressively spaced slit structures extending through a stack structure, the series of progressively spaced slit structures defining a series of blocks of pillars comprising at least some pillars exhibiting bending,
wherein, within an area of the series of progressively spaced slit structures, for each block neighboring two blocks of the series of blocks defined by the series of progressively spaced slit structures the each block is of equally greater width relative to a first of the two neighboring blocks as it is lesser in width relative to a second of the two neighboring blocks.

23. The electronic system of claim 22, wherein the stack structure comprises a vertically alternating sequence of insulative structures and conductive structures arranged in tiers, the conductive structures comprising at least one conductive material comprising:
a first conductive material within a conductive liner material, the conductive liner material being directly adjacent the insulative structures; or
a conductive polysilicon material adjacent the insulative structures.

* * * * *

UNITED STATES PATENT AND TRADEMARK OFFICE
CERTIFICATE OF CORRECTION

PATENT NO. : 11,641,741 B2
APPLICATION NO. : 17/016039
DATED : May 2, 2023
INVENTOR(S) : Kaiming Luo et al.

It is certified that error appears in the above-identified patent and that said Letters Patent is hereby corrected as shown below:

In the Claims

| | | | |
|---|---|---|---|
| Claim 1, | Column 27, | Line 19, | change "of blocks the" to --of blocks, the-- |
| Claim 10, | Column 28, | Line 27, | change "wherein for each" to --wherein, for each-- |
| Claim 10, | Column 28, | Line 29, | change "of blocks the" to --of blocks, the-- |
| Claim 12, | Column 28, | Line 47, | change "tiers the other" to --tiers, the other-- |
| Claim 22, | Column 30, | Line 22, | change "structures the each" to --structures, the each-- |

Signed and Sealed this
Tenth Day of October, 2023

Katherine Kelly Vidal
*Director of the United States Patent and Trademark Office*